US011500614B2

(12) United States Patent
Hekmatshoartabari et al.

(10) Patent No.: US 11,500,614 B2
(45) Date of Patent: Nov. 15, 2022

(54) STACKED FET MULTIPLY AND ACCUMULATE INTEGRATED CIRCUIT

(71) Applicant: INTERNATIONAL BUSINESS MACHINES CORPORATION, Armonk, NY (US)

(72) Inventors: Bahman Hekmatshoartabari, White Plains, NY (US); Ruilong Xie, Niskayuna, NY (US); Alexander Reznicek, Troy, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 286 days.

(21) Appl. No.: 16/871,459

(22) Filed: May 11, 2020

(65) Prior Publication Data

US 2021/0349691 A1    Nov. 11, 2021

(51) Int. Cl.
*G06F 7/544* (2006.01)
*H01L 29/786* (2006.01)
(Continued)

(52) U.S. Cl.
CPC ...... *G06F 7/5443* (2013.01); *H01L 21/02532* (2013.01); *H01L 21/02603* (2013.01); *H01L 21/3065* (2013.01); *H01L 21/823807* (2013.01); *H01L 21/823814* (2013.01); *H01L 21/823871* (2013.01); *H01L 23/528* (2013.01); *H01L 27/0629* (2013.01); *H01L 27/0922* (2013.01); *H01L 28/60* (2013.01); *H01L 29/0673* (2013.01); *H01L 29/42392* (2013.01);
(Continued)

(58) Field of Classification Search
CPC combination set(s) only.
See application file for complete search history.

(56) References Cited

U.S. PATENT DOCUMENTS 6,326,275 B1    12/2001    Harrington
9,685,499 B1    6/2017    Bi
(Continued)

FOREIGN PATENT DOCUMENTS

WO    2019053549 A1    3/2019
WO    2021014258 A1    1/2021

OTHER PUBLICATIONS

Hoskins, et al., "Streaming Batch Eigenupdates for Hardware Neural Networks", Frontiers in Neuroscience, Aug. 6, 2019, vol. 13, Article 793, 9 pages.
(Continued)

*Primary Examiner* — Nduka E Ojeh
(74) *Attorney, Agent, or Firm* — L. Jeffrey Kelly

(57) ABSTRACT

An embodiment of the invention may include a method of forming and a resulting multiply-and-accumulate device. The device may include a capacitor in a second region. The capacitor comprises a dielectric located between a first metal contact and a second metal contact. The device may include a stacked nanosheet device in the first region from the nanosheet. The stacked nanosheet device may include a top transistor and a bottom transistor in contact with the first metal contact. The device may include a nanosheet device in the third region, wherein a source/drain of a transistor of the nanosheet device is in contact with the first metal contact.

19 Claims, 19 Drawing Sheets

(51) Int. Cl.

| | |
|---|---|
| *H01L 29/423* | (2006.01) |
| *H01L 21/02* | (2006.01) |
| *H01L 21/3065* | (2006.01) |
| *H01L 21/8238* | (2006.01) |
| *H01L 29/66* | (2006.01) |
| *H01L 27/06* | (2006.01) |
| *H01L 27/092* | (2006.01) |
| *H01L 49/02* | (2006.01) |
| *H01L 23/528* | (2006.01) |
| *H01L 29/06* | (2006.01) |
| *G06N 3/063* | (2006.01) |

(52) U.S. Cl.
CPC .. *H01L 29/66545* (2013.01); *H01L 29/66742* (2013.01); *H01L 29/78618* (2013.01); *H01L 29/78696* (2013.01); *G06N 3/0635* (2013.01)

(56) References Cited

U.S. PATENT DOCUMENTS

| | | |
|---|---|---|
| 9,985,097 B2 | 5/2018 | Cheng |
| 10,127,494 B1 | 11/2018 | Cantin |
| 10,256,231 B2 | 4/2019 | Cheng |
| 10,269,425 B2 | 4/2019 | Gokmen |
| 10,283,516 B1 | 5/2019 | Reznicek |
| 10,541,242 B2 | 1/2020 | Reznicek |
| 10,833,146 B2 | 11/2020 | Xu |
| 11,069,684 B1 | 7/2021 | Xie |
| 2016/0343452 A1 | 11/2016 | Ikeda |
| 2018/0083046 A1* | 3/2018 | Cheng .................... H01L 28/82 |
| 2019/0080230 A1 | 3/2019 | Hatcher |
| 2019/0138893 A1 | 5/2019 | Sharma |
| 2019/0181338 A1 | 6/2019 | Hashemi |
| 2019/0221277 A1 | 7/2019 | Reznicek |
| 2020/0020695 A1 | 1/2020 | Leobandung |
| 2021/0265345 A1* | 8/2021 | Xie ................ H01L 21/823864 |

OTHER PUBLICATIONS

Li, et al., "Capacitor-based Cross-point Array for Analog Neural Network with Record Symmetry and Linearity", 2018 Symposium on VLSI technology Digest of Technical Papers, pp. 25-26, Yorktown Heights, NY, US.

Wang et al., "Training Deep Neural Networks with 8-bit Floating Point Numbers," 32nd Conference on Neural Information Processing Systems, NeurIPS, 2018, [Accessed on Jan. 13, 2020], 2 pages, Retrieved from the Internet: <URL: https://papers.nips.cc/paper/7994-training-deep-neural-networks-with-8-bit-floating-point- . . . Jan. 13, 2020>.

Wikipedia, "Transistor count," The Free Encyclopedia, [accessed on May 11, 2020], 36 pages, Retrieved from the Internet: <URL: https://en.wikipedia.org/wiki/Transistor_count>.

Ambrogio et al., "Equivalent-accuracy accelerated neural-network training using analogue memory," Nature, vol. 558, Jun. 7, 2018, 23 pages.

IBM: List of IBM Patents or Patent Applications Treated as Related (Appendix P), Aug. 5, 2022, 2 pages.

Pending Application No. CN2022/099146, Filed on Jun. 16, 2022, entitled: "Semiconductor Structure With Embedded Capacitor", 69 pages.

Pending U.S. Appl. No. 17/403,992, filed Aug. 17, 2021, entitled: "Semiconductor Structure With Embedded Capacitor", 70 pages.

Notification of Transmittal of the International Search Report and the Written Opinion of the International Searching Authority, or the Declaration, dated Sep. 16, 2022, Applicant's or agent's file reference F22W2275, International application No. PCT/CN2022/099146, 9 pages.

* cited by examiner

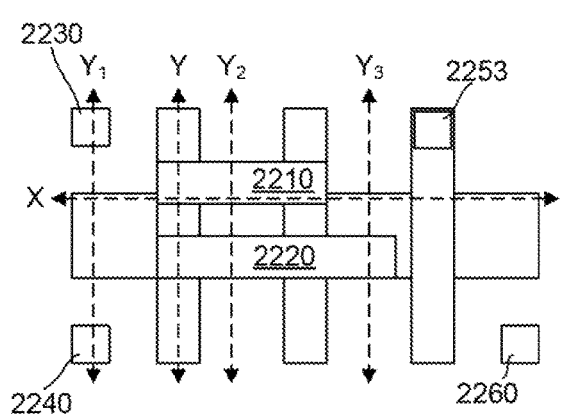
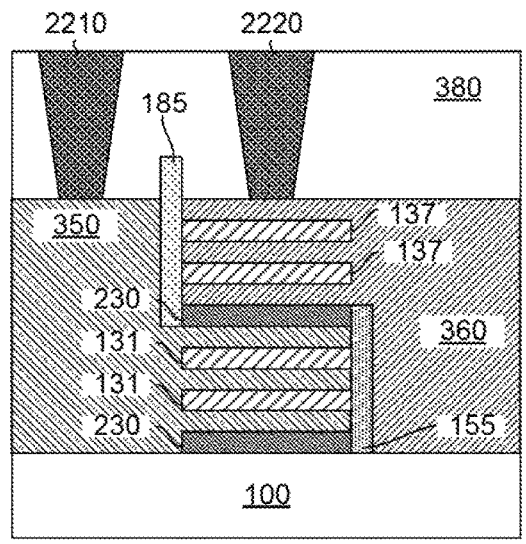
FIG. 23a
FIG. 23b
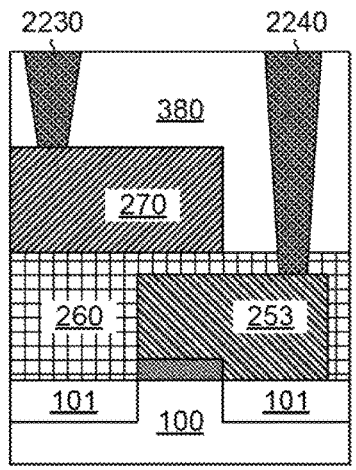
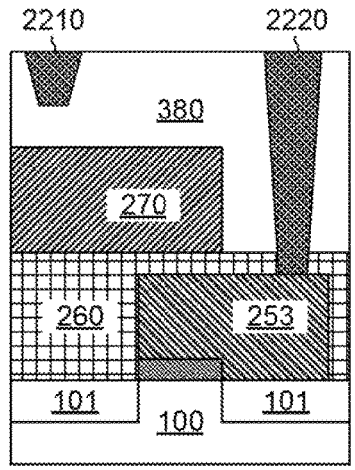
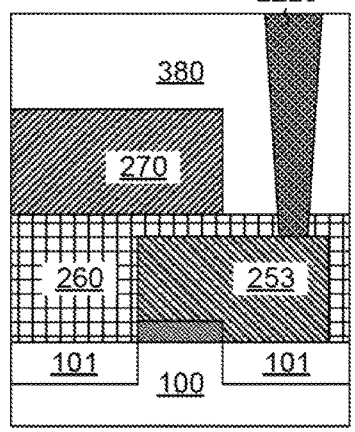
FIG. 23c  FIG. 23d  FIG. 23e
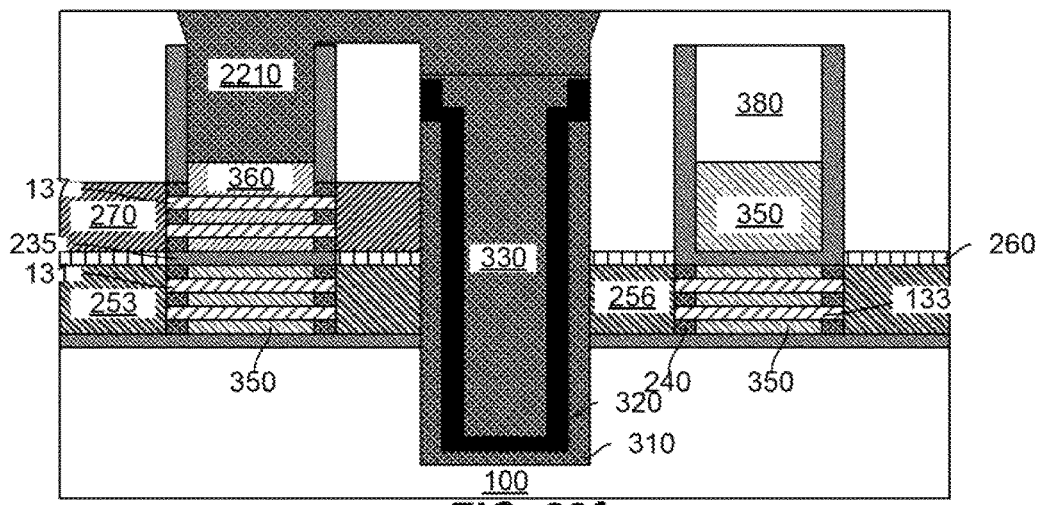
FIG. 23f

STACKED FET MULTIPLY AND ACCUMULATE INTEGRATED CIRCUIT

BACKGROUND

The present invention relates to semiconductor device fabrication, and more specifically, to stacked FET gates.

Stacked nanosheet designs provide a significant gain for both logic and memory device structural scaling by stacking FETs above one another. The stacked nanosheet device allows for 2 n-FETs, 2 p-FETs, or a combination of n-FET and p-FET devices located in the same footprint of a nanosheet.

BRIEF SUMMARY

An embodiment of the invention may include a method for forming a multiply-and-accumulate circuit. The method may include forming a nanosheet stack having a first region, a second region, and a third region, wherein the second region is between the first region and the third region. The method may include forming a capacitor in the second region, wherein the capacitor comprises a dielectric located between a first metal contact and a second metal contact. The method may include forming a stacked nanosheet device in the first region from the nanosheet stack, wherein the stacked nanosheet device comprises a top transistor and a bottom transistor, and wherein a source/drain of the top transistor and a source/drain of the bottom transistor are in contact with the first metal contact. The method may include forming a stacked nanosheet transistor in the third region, wherein a source/drain of the stacked nanosheet transistor is in contact with the first metal contact.

An embodiment of the invention may include a multiply-and-accumulate device. The device may include a capacitor in the second region, wherein the capacitor comprises a dielectric located between a first metal contact and a second metal contact. The device may include a stacked nanosheet device in the first region from the nanosheet. The stacked nanosheet device may include a top transistor and a bottom transistor in contact with the first metal contact. The device may include a nanosheet device in the third region, wherein a source/drain of a transistor of the nanosheet device is in contact with the first metal contact.

BRIEF DESCRIPTION OF THE DRAWINGS

FIG. 23a depicts a top down view of a wiring layout for the Multiply & Accumulate of FIG. 1a, according to an example embodiment.

FIG. 23b depicts wiring along the Y cross-section, according to an example embodiment.

FIG. 23c depicts wiring along the $Y_1$ cross-section, according to an example embodiment.

FIG. 23d depicts wiring along the $Y_2$ cross-section, according to an example embodiment.

FIG. 23e depicts wiring along the $Y_3$ cross-section, according to an example embodiment.

FIG. 23f depicts wiring along the X cross-section, according to an example embodiment.

Figure 1A:
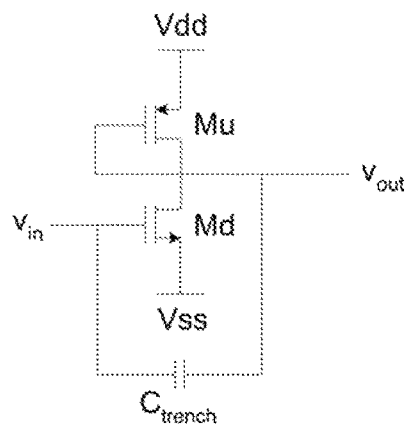
FIG. 1a depicts an example electrical diagram of a multiply-and-accumulate configuration, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to an example embodiment set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Recent advancements in deep learning algorithms allow for reduced precision computations. For example, the algorithms may rely on 8 bits for training and 4 bits for inference calculation, as compared to the conventional 32-bit floating-point algorithms. As multiply-and-accumulate operations are the most space and power consumptive components in a digital implementation of a neural network, a reduction to a 4 or 8-bit architecture can drastically improve performance (e.g., faster operation, and/or less power usage per operation).

Figure 1B:
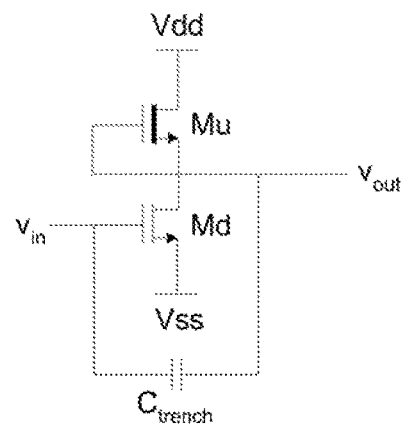
FIG. 1b depicts an example electrical diagram of a multiply-and-accumulate configuration, according to an example embodiment.
Figure 1C:
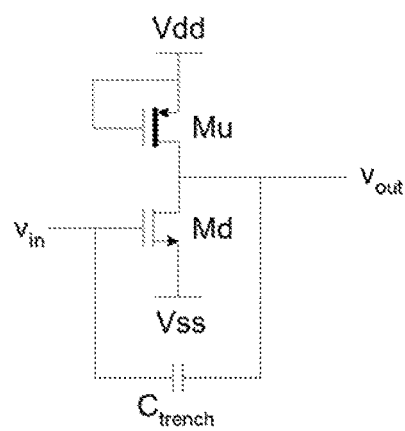
FIG. 1c depicts an example electrical diagram of a multiply-and-accumulate configuration, according to an example embodiment.
Figure 1D:
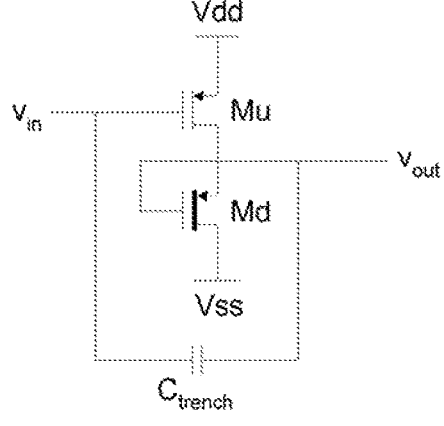
FIG. 1d depicts an example electrical diagram of a multiply-and-accumulate configuration, according to an example embodiment.
Figure 1E:
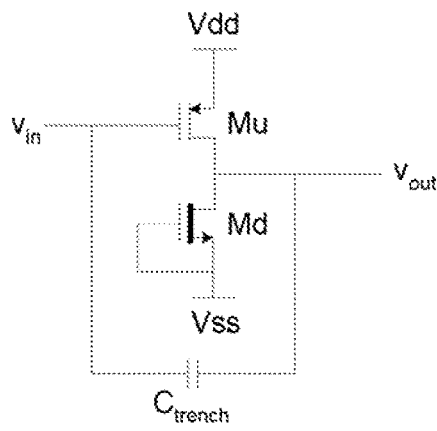
FIG. 1e depicts an example electrical diagram of a multiply-and-accumulate configuration, according to an example embodiment.
Figure 1F:
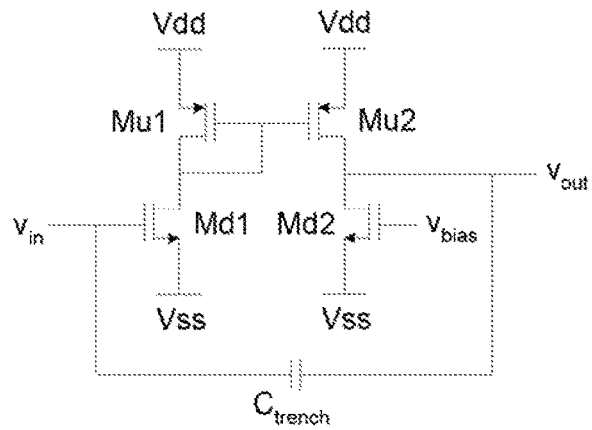
FIG. 1f depicts an example electrical diagram of a multiply-and-accumulate configuration, according to an example embodiment.

Contained in the current disclosure is a multiply-and-accumulate integrated circuit including an amplifier, using a stacked nanosheet transistor with a trench capacitor. The multiply-and-accumulate circuit may be utilized as an electronic neuron in an artificial neural network. For example, FIG. 1a-1f depict 6 embodiments of a multiply-and-accumulate circuit which may be made using the disclosed process. FIG. 1a-1e depicts single-ended circuit implementations whereas FIG. 1f depicts a differential circuit implementation. Each single-ended circuit as depicted in FIG. 1a-1e is comprised of a pull up transistor, a pull-down transistor, a reset transistor and a trench capacitor. FIG. 1a depicts an enhancement-mode pull-down nFET and an enhancement-mode pull-up pFET. FIG. 1b depicts an enhancement-mode pull-down nFET and a depletion-mode pull-up nFET. FIG. 1c depicts an enhancement-mode pull-down nFET, and a depletion-mode pull-up pFET. FIG. 1d depicts a depletion-mode pull-down pFET and an enhancement-mode pull-up pFET. FIG. 1e depicts a depletion-mode pull-down nFET and an enhancement-mode pull-up pFET. FIG. 1f depicts a differential configuration of the multiply and accumulate circuit of FIG. 1a, where two pairs of enhancement-mode pull-down/pull-up nFET/pFET devices form a current mirror. Similarly, the single-ended circuits of FIG. 1b-1e can be configured as differential circuits (not shown). In the exemplary embodiments of FIG. 1a-1f, the reset transistor is comprised of an enhancement-mode nFET; however, a pFET, a depletion-mode FET, or a complementary nFET/pFET pair may be used as well. The reset transistor functions as a reset switch for resetting the output voltage (Vout) of the multiply and accumulated circuit to an initial value. The reset transistor is connected to a reference voltage which may be, for instance, a negative supply voltage (VS S), as in the depicted embodiments.

Figure 2:
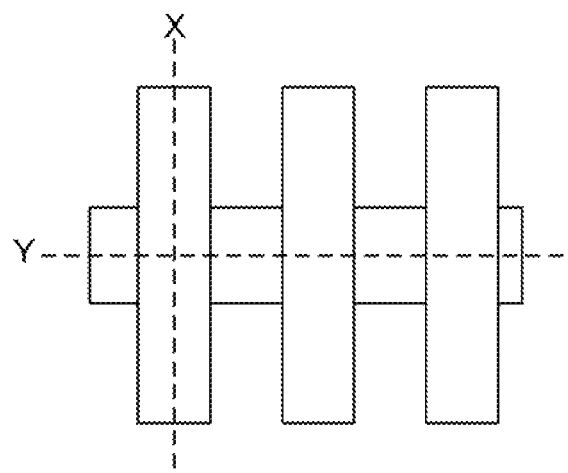
FIG. 2 depicts a top down view of a layout of dummy gates over a nanosheet stack showing the x and y cross sections, according to an example embodiment.

Referring to FIG. 2, a top down view of gates over a nanosheet stack is depicted to give perspective of the orientation of the x and y cross sections.

Figure 3:
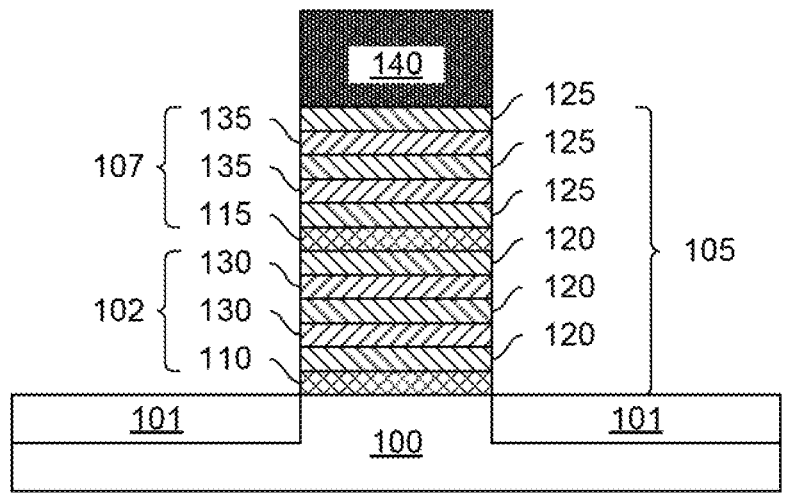
FIG. 3 depicts a nanosheet stack along the x-cross section, according to an example embodiment.

Referring to FIG. 3, the depicted structure may include one or more nanosheet stacks 105 located on the substrate 100, separated by an STI 101 embedded in the substrate 100. According to an example embodiment, substrate 100 is a bulk semiconductor wafer, such as a bulk silicon (Si), bulk germanium (Ge), and/or bulk III-V semiconductor wafer. Alternatively, substrate 100 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 100 may already have pre-built structures (not shown) such as transistors, diodes, capacitors, resistors, interconnects, wiring, etc.

The term 'nanosheet,' as used herein, refers to a sheet or a layer having nanoscale dimensions. Further, the term 'nanosheet' is meant to encompass other nanoscale structures such as nanowires. For instance, 'nanosheet' can refer to a nanowire with a larger width, and/or 'nanowire' can refer to a nanosheet with a smaller width, and vice versa.

Generally, the nanosheet stack 105 includes lower nanosheets 102, etc. separated from the substrate 100 by a first sacrificial nanosheet 110, and upper nanosheets 107, etc. separated from the lower nanosheets by a second sacrificial nanosheet 115. By 'sacrificial' it is meant that the layer, or portion thereof, is removed during fabrication of the device. By way of example only, each of the nanosheets 110, 115, 120, 125, 130, and 135 in nanosheet stack 105 are deposited onto the substrate 100, one on top of the other, using an epitaxial growth process. According to an example embodiment, each of the nanosheets 110, 115, 120, 125, 130, and 135 in nanosheet stack 105 has a thickness of from about 10 nanometers (nm) to about 25 nm and ranges therebetween.

The lower nanosheets 102 in nanosheet stack 105 include alternating layers of a first nanosheet material 120 and a second nanosheet material 130. For instance, according to an example embodiment, the first nanosheet material 120 is SiGe, and the second nanosheet material 130 is Si. However, this is merely an example and other configurations are contemplated herein. Additionally, while there are two nanosheets for the second nanosheet material 130, additional nanosheets are contemplated. For instance, in an alternative embodiment, the first nanosheet material is Si while the second nanosheet material is SiGe. As will be described in detail below, these nanosheet materials will be used to form the channels of the present stacked nanosheet devices and a sacrificial material in between the channels. Removal of the sacrificial material releases the channels from the stack and permits gates to be formed that fully surround the channels in a gate-all-around configuration. Thus, it is preferable that the first and second nanosheet materials have etch selectivity with respect to one another. Thus, when one serves as the channels, the other sacrificial material can be selectively removed to release the channels from the stack. By way of example only, Si and SiGe provide such etch selectivity.

Similarly, the upper nanosheets 107 in nanosheet stack 105 include alternating layers of the first nanosheet material 125 and the second nanosheet material 135. For instance, when the first nanosheet material 125 is SiGe and the second nanosheet material 135 is Si. Again, this is merely an example and other configurations are possible, e.g., the first nanosheet material can instead be Si while the second nanosheet material is SiGe. Additionally, while there are two nanosheets for the second nanosheet material 135, additional nanosheets are contemplated. Further, the size of the nanosheet stack 105 shown is merely an example, and embodiments are contemplated herein where the number of lower nanosheets and/or upper nanosheets differ from what is shown in the figures.

According to an example embodiment, sacrificial nanosheets 110 and 115 are both formed from SiGe having a high germanium (Ge) content. For example, in one exemplary embodiment, a high Ge content is from about 50% Ge to about 100% Ge (i.e., pure Ge) and ranges therebetween. For instance, in one non-limiting example, sacrificial nanosheets 110 and 115 are formed from SiGe60 (which has a Ge content of about 60%). Use of a higher Ge content SiGe will enable the sacrificial nanosheets 110 and 115 to be etched selective to the lower nanosheets 102 and upper nanosheets 107 in nanosheet stack 105 which, as provided above, can be formed from Si and/or SiGe. Notably, however, the SiGe used as a lower/upper nanosheet material has a low Ge content. For example, in one exemplary embodiment, a low Ge content is from about 20% Ge to about 50% Ge and ranges therebetween. For instance, in one non-limiting example, first nanosheet material 120 and first nanosheet material 125 are formed from SiGe30 (which has a Ge content of about 30%).

A patterned nanosheet hardmask 140 is then formed on the nanosheets marking the footprint and location of at least one individual nanosheet device stack 105. Suitable materials for the nanosheet hardmask 140 include, but are not limited to, nitride materials such as silicon nitride ($Si_xN_y$), silicon oxynitride (SiON), and/or silicon carbonide nitride (SiCN), and/or oxide materials such as silicon oxide ($SiO_x$).

The nanosheet hardmask 140 is then used to pattern nanosheet stack into at least one individual nanosheet device stack 105. Nanosheet device stack 105 contains a patterned portion of each of the nanosheets from the originally deposited nanosheet stack.

Shallow trench isolation (STI) regions 101 are then formed in the substrate 100 at the base of the nanosheet device stack 105. According to an example embodiment, STI regions 101 may be formed from an oxide material (also referred to herein as an "STI oxide") such as silicon oxide (SiOx). Although not explicitly shown in the figures, a liner (e.g., a thermal oxide or silicon nitride (SiN)) may be deposited prior to the STI oxide.

Figure 4:
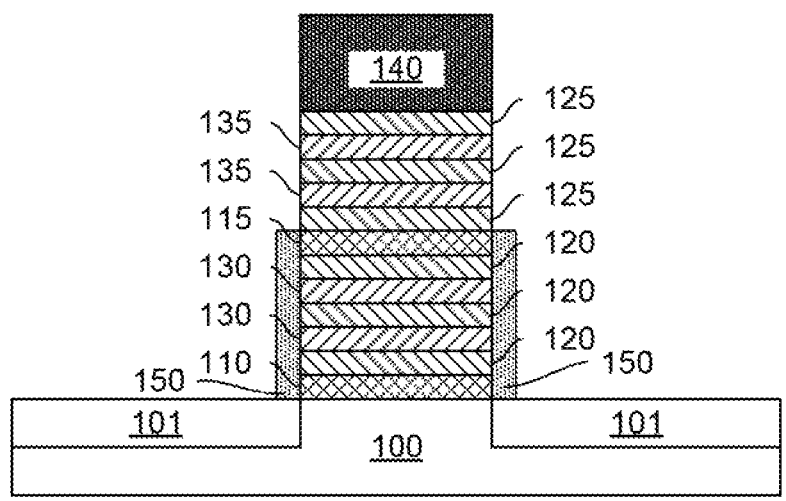
FIG. 4 depicts formation of first spacers adjacent to a nanosheet stack along the x-cross section, according to an example embodiment.

Referring to FIG. 4, first sidewall spacers 150 are then formed alongside the lower nanosheets 102 and sacrificial nanosheets 110 and 115 of the nanosheet device stack 105. IN an embodiment, the height of the height of the first sidewall spacers 150 should be at least to the bottom surface of the sacrificial nanosheet 115. Suitable materials for the first sidewall spacers 150 include dielectrics such as, for example, silicon oxycarbide (SiOC).

According to an example embodiment, standard fabrication techniques are employed to form the first sidewall spacers 150. For instance, full stack sidewall spacers are first formed alongside the nanosheet device stack 105. A planarizing material (not shown) such as an organic planarizing layer (OPL) material may be deposited onto substrate 100 and recessed to a height alongside the nanosheet device stack 105, just beyond the second sacrificial nanosheet 115. A casting process such as spin coating or spray casting can be employed to deposit the planarizing material onto the substrate 100. A directional (anisotropic) etching process such as RIE can be used to recess the planarizing material. The full stack sidewall spacers are then recessed to about the height of the planarizing material (e.g., using an anisotropic etching process such as RIE) to form the first sidewall spacers 150 shown in FIG. 8 alongside the lower nanosheets 102 and sacrificial nanosheets 110 and 115 of the nanosheet device stack 105, after which the planarizing material is removed. By way of example only, an OPL planarizing material can be removed using a process such as ashing.

Figure 5:
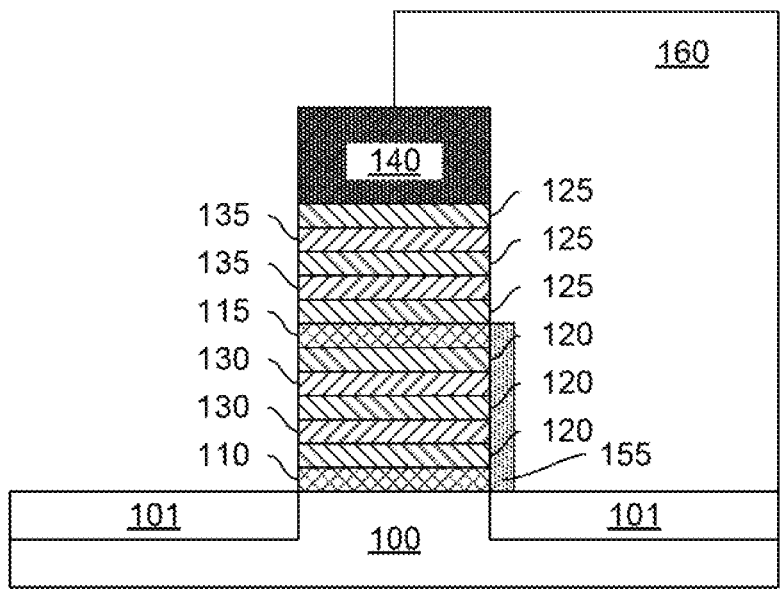
FIG. 5 depicts removal of a first side of the first spacers adjacent to a nanosheet stack along the x-cross section, according to an example embodiment.

Referring to FIG. 5, the first sidewall spacers 150 may be selectively removed a first side of the nanosheet device stack 105, leaving a first spacer 155 on a second side of the nanosheet device stack. As will be described in detail below in FIG. 7 and FIG. 8, the second sidewall spacers 180 are located along the upper nanosheet device stack 105 will be selectively removed from the other (second) side of the nanosheet device stack 105, thus enabling formation of a ζ-shaped dielectric design (see FIG. 22a&b). To selectively remove the first sidewall spacers 150 from the first side of the nanosheet device stack 105, a patterned mask 160 is formed over the second side of the nanosheet device stack 105 covering the first sidewall spacers 150 alongside the second side of the nanosheet device stack 105. It is notable that the depiction in the figures of the first and second sides corresponding to the left and right sides of the nanosheet device stack 105 is completely arbitrary. All that is important is the first and second sides of the nanosheet device stack 105 are opposite one another along the stack sidewall. Suitable materials for mask 160 include, but are not limited to, an OPL material. Standard lithography and etching techniques can be employed to pattern the mask 160. For instance, a lithographic stack (not shown), e.g., photoresist and anti-reflective coating (ARC), is used to pattern mask 160.

Figure 6:
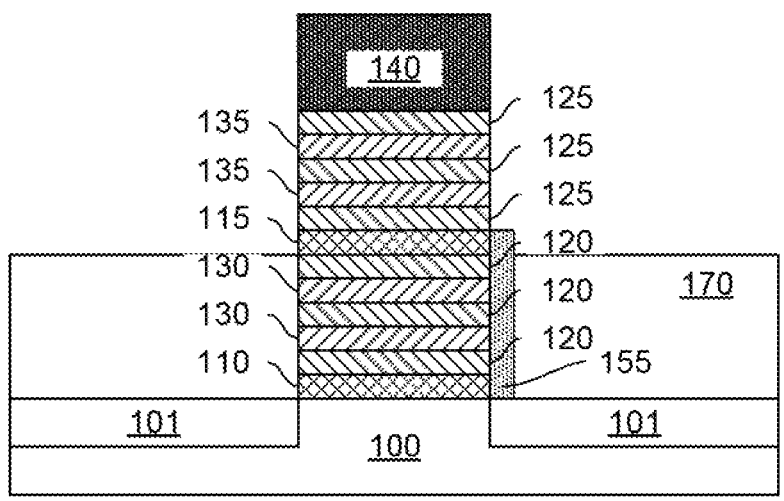
FIG. 6 depicts forming a bottom mask along the x-cross section, according to an example embodiment.

Referring to FIG. 6, first sidewall mask 160 is removed and a base mask 170 is deposited. A base mask 170 such as an organic planarizing layer (OPL) material may be deposited onto substrate 100 and recessed to a height just to the bottom of second sacrificial nanosheet 115 alongside the nanosheet device stack 105, just above a bottom surface of the second sacrificial nanosheet 115. A casting process such as spin coating or spray casting can be employed to deposit the planarizing material onto the substrate 100. A directional (anisotropic) etching process such as RIE can be used to recess the planarizing material. By way of example only, a base mask 170 of an OPL material may be removed using a process such as ashing.

Figure 7:
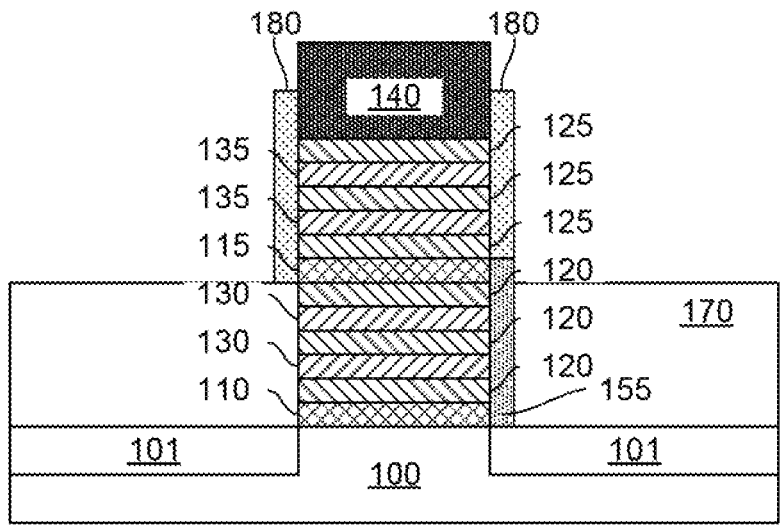
FIG. 7 depicts formation of second spacers adjacent to a nanosheet stack along the x-cross section, according to an example embodiment.

Referring to FIG. 7, the process is then repeated to form the second sidewall spacers along the upper sidewalls of the nanosheet device stack 105, followed by their selective removal from the other (second) side of the nanosheet device stack 105. The second sidewall spacers 180 may be formed alongside the upper nanosheets 107 and sacrificial nanosheets 110 and 115 of the nanosheet device stack 105. Suitable materials for the second sidewall spacers 180 include, but are not limited to, and/or silicon oxycarbide (SiOC).

Figure 8:
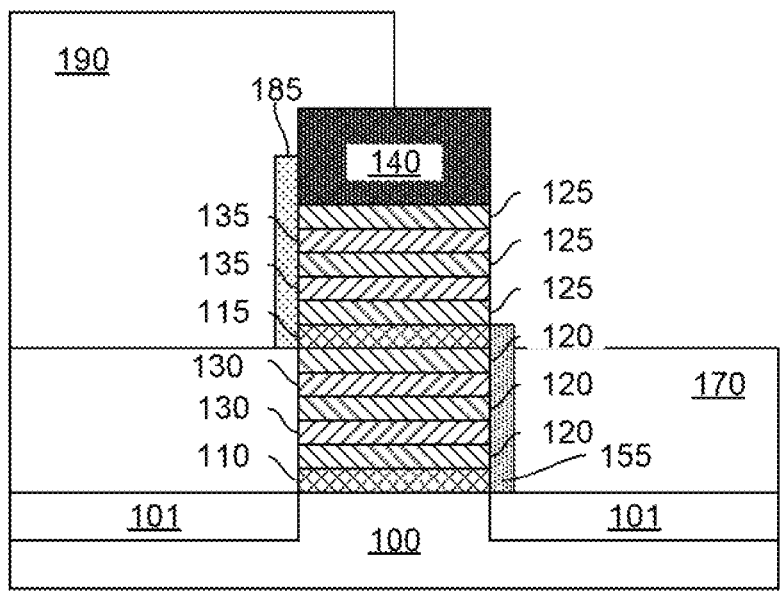
FIG. 8 depicts removal of a second side of the second spacers adjacent to a nanosheet stack along the x-cross section, according to an example embodiment.

Referring to FIG. 8, a patterned mask 190 is formed on base mask 170 masking/covering the second sidewall spacers 180 along the second side of the nanosheet device stack 105. Suitable materials for mask 190 include, but are not limited to, an OPL material. Standard lithography and etching techniques (see above) can be employed to pattern the mask 190.

With mask 190 covering the first sidewall spacers 150 along the second side of the nanosheet device stack 105, (second) sidewall spacers 180 are then formed alongside the upper nanosheet device stack 105 and hardmask 140. It is notable that, as will be described in detail below, sidewall spacers 180 will eventually be removed in their entirety and a portion of the sidewall spacers 180 will be replaced with the (ζ-shaped) dielectric spacer. Suitable materials for the sidewall spacers 185 include, but are not limited to, metal oxides such as titanium oxide (TiO$_2$) and/or tantalum oxide (Ta$_2$O$_5$) and/or high Ge content SiGe (SiGe having a Ge content of from about 50% Ge to about 100% Ge and ranges there between such as SiGe with 60%). As provided above, etchants such as dry HCl are selective SiGe. As shown in FIG. 5, on the first/left side of the nanosheet device stack 105, sidewall spacers 185 are present along the stack sidewall above the mask 170. On the second/right side of the nanosheet device stack 105, sidewall spacers 185 are present along the stack sidewall. Pattern mask 190 and base mask 170 are then removed. By way of example only, pattern mask 190 and base mask 170 may be removed using a process such as ashing.

Figure 9A:
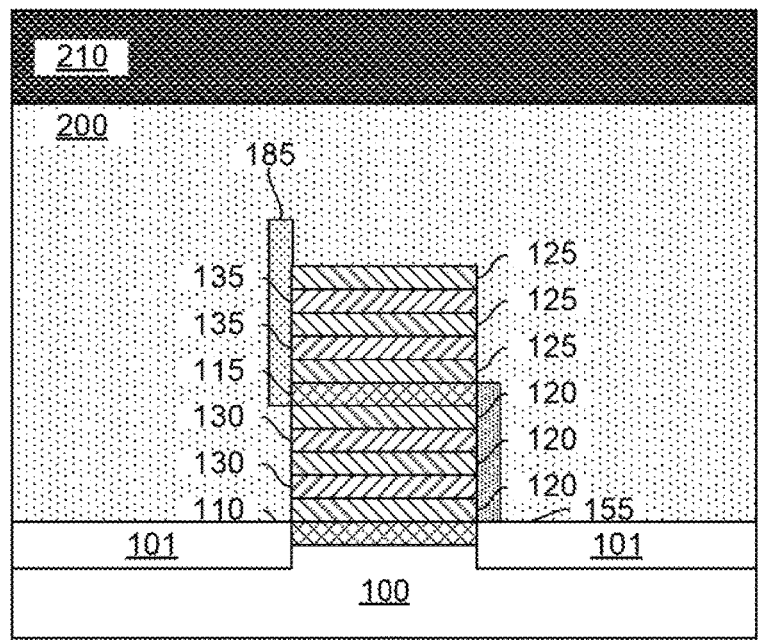
FIG. 9a depicts sacrificial gate formation along the x-cross section, according to an example embodiment.
Figure 9B:
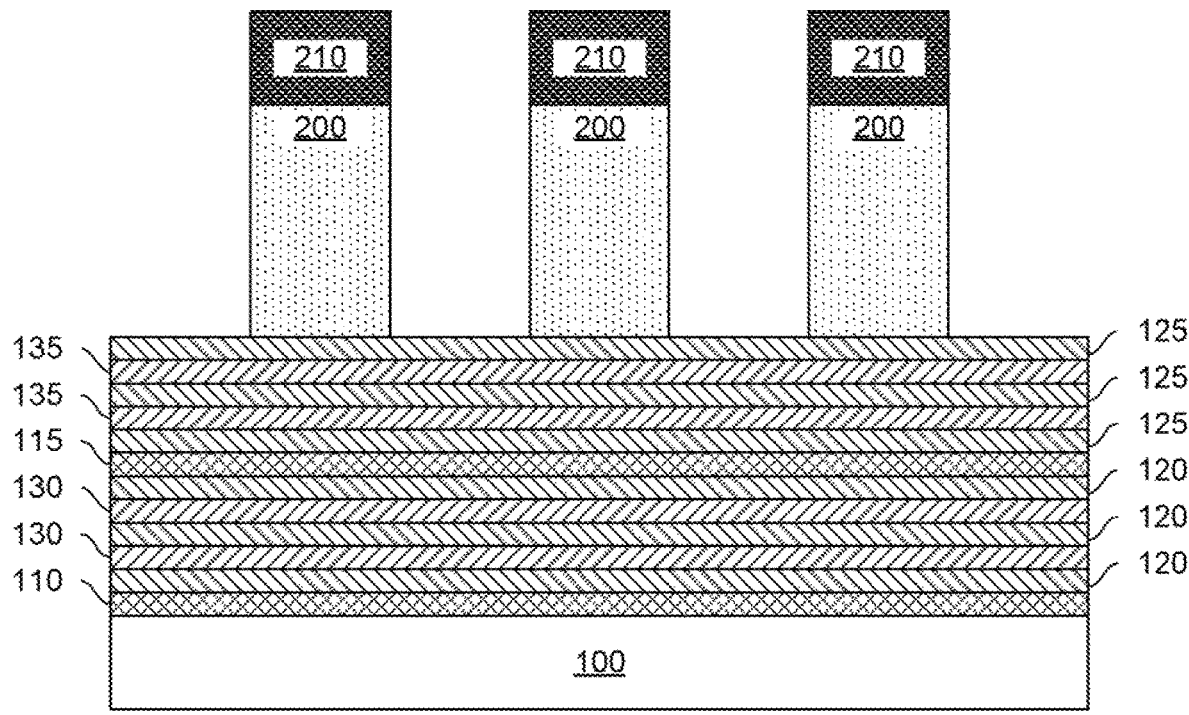
FIG. 9b depicts sacrificial gate formation along the y-cross section, according to an example embodiment.

Referring to FIG. 9a&b, sacrificial gates 200 are then formed on the nanosheet device stack 105 over channel regions of the stacked nanosheet device. To form sacrificial gates 200, a sacrificial gate material is first blanket deposited over the nanosheet device stack 105. Suitable sacrificial gate materials include, but are not limited to, ploy-silicon (poly-Si) and/or amorphous silicon (a-Si). A process such as CVD, ALD or PVD can be employed to deposit the sacrificial gate material over the nanosheet device stack 105.

Sacrificial gates 200 serve as a placeholder for the final gates of the stacked nanosheet device. Namely, sacrificial gates 200 will be removed later in the process and replaced with metal gate stacks that will serve as the final gates of the stacked nanosheet device. Thus, these final gates of the stacked nanosheet device are also referred to herein as "replacement metal gates" or simply "RMG." Use of an RMG process is advantageous because it prevents exposure of the metal gate stack materials to potentially damaging conditions during subsequent processing steps. For instance, the high-κ dielectrics used in the RMG gate stacks can be damaged by exposure to high temperatures. Thus, these gate stack materials are only placed near the end of the process.

Sacrificial gate hardmasks 210 are then formed on the sacrificial gate material marking the footprint and location of each of the sacrificial gates 200. Suitable materials for the sacrificial gate hardmasks 210 include, but are not limited to, nitride hardmask materials such as SiN, SiON and/or SiCN, and/or oxide hardmask materials such as SiOx. An etch using the sacrificial gate hardmasks 210 is then used to pattern the sacrificial gate material into the individual sacrificial gates 200 shown in FIG. 9a&b. A directional (anisotropic) etching process such as RIE can be employed for the sacrificial gate etch.

One of the sacrificial gates 200 having been formed on the nanosheet device stack 105 is also depicted in FIG. 9a&ba. As shown in FIG. 9a&ba, the sacrificial gates 200 surround the nanosheet device stack 105, the first sidewall spacer 155 along the lower portion of the second/right sidewall of the nanosheet device stack 105, and the second sidewall spacer 185 along the upper first/left sidewall of the nanosheet device stack 105.

Figure 10A:
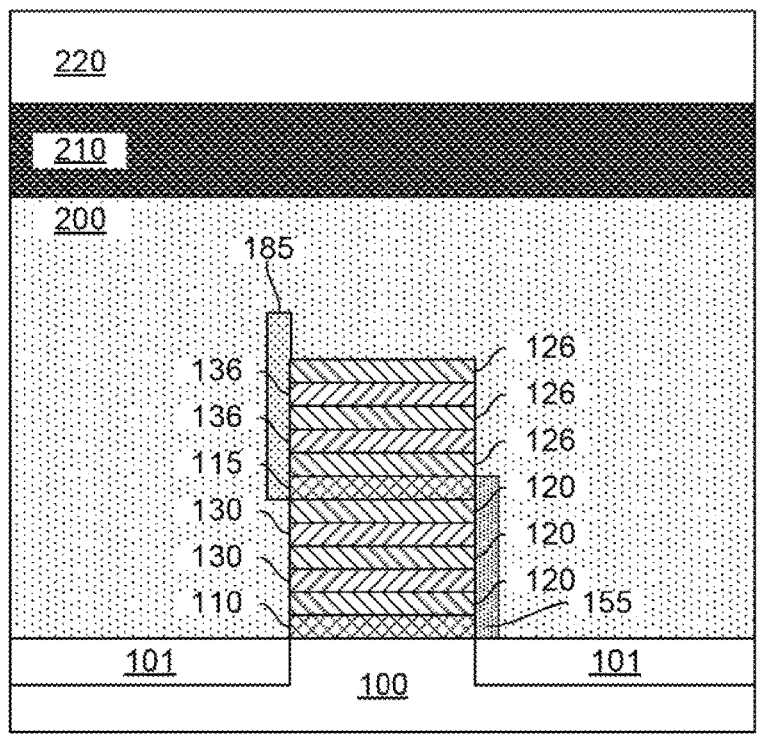
FIG. 10a depicts reducing a top portion of a third nanosheet stack along the x-cross section, according to an example embodiment.
Figure 10B:
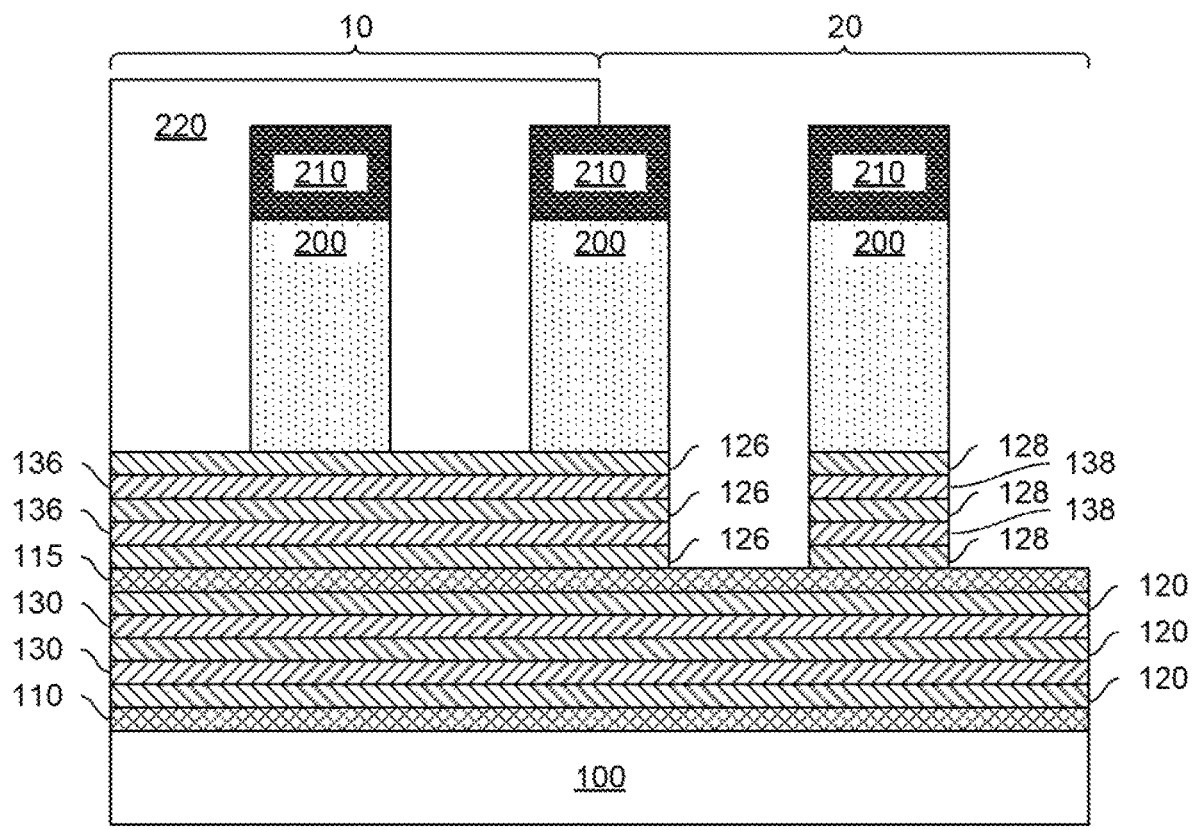
FIG. 10b depicts reducing a top portion of a third nanosheet stack along the y-cross section, according to an example embodiment.

Referring to FIG. 10a&b, sacrificial gates 200 and first region mask 220 in a first region 10 may be used to pattern trenches in nanosheet device stack 105 in between the sacrificial gates 200. A directional anisotropic etching process such as RIE can be employed for the trench etch. As shown in FIG. 10a&b, this etch patterns nanosheet device stack 105 into the top portion of nanosheet stack 32 in a second portion 20 of the nanosheet device stack.

Figure 11A:
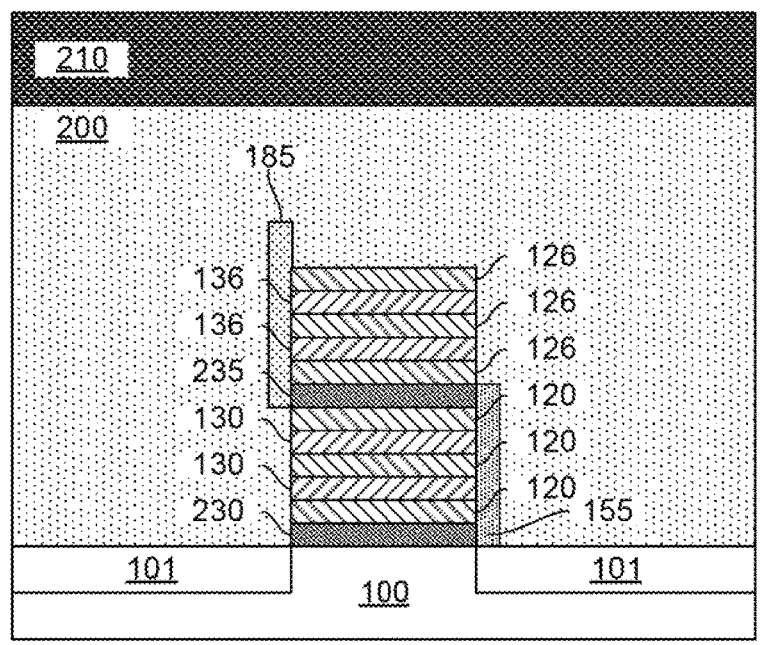
FIG. 11a depicts removing the sacrificial nanosheets and depositing spacers along the x-cross section, according to an example embodiment.
Figure 11B:
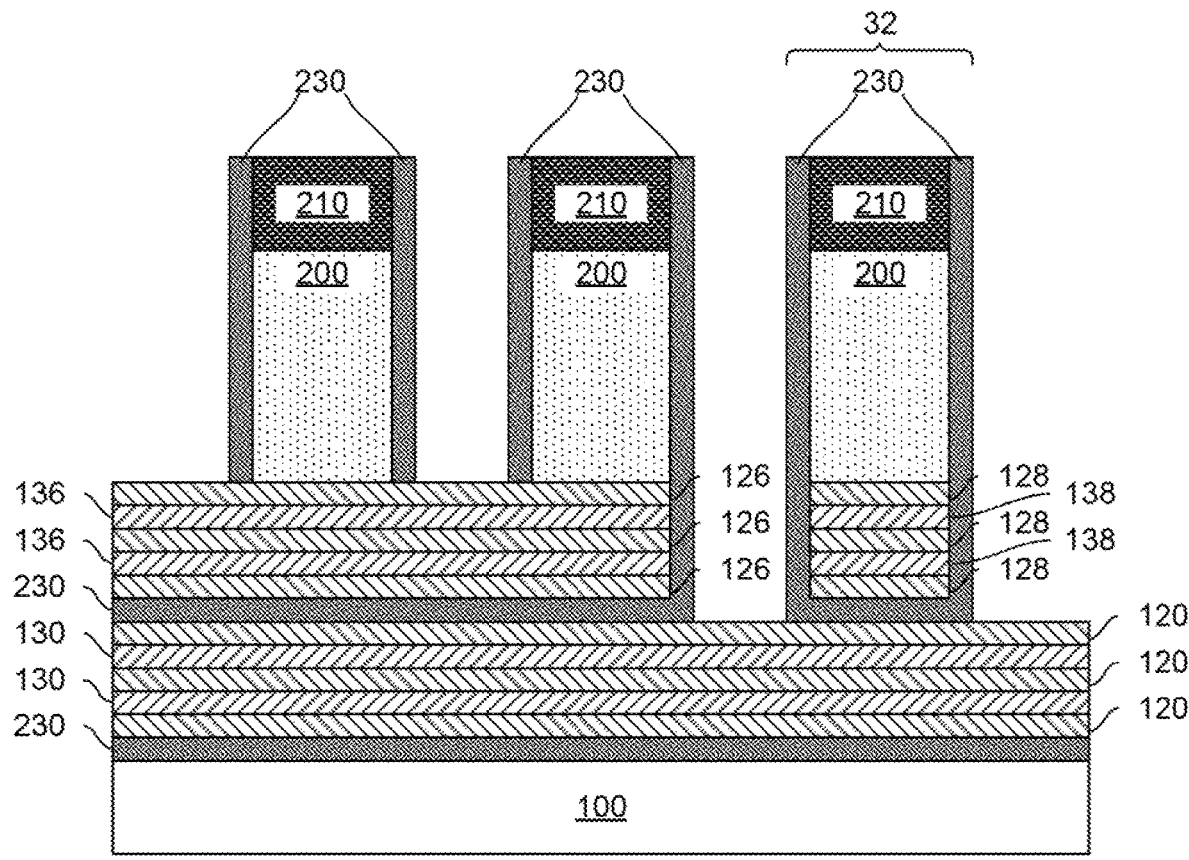
FIG. 11b depicts removing the sacrificial nanosheets and depositing spacers along the y-cross section, according to an example embodiment.

Referring to FIG. 11a&b, the first region mask 220 may be removed and the sacrificial nanosheets 110 and 115 (see FIG. 14a&b) are then selectively removed in the nanosheet device stack 105 and sacrificial gates 200. By way of example only, first region mask 220 may be removed using a process such as ashing. According to an example embodiment, a non-directional (isotropic) etching process (or combination of etching processes) can be employed to remove the sacrificial nanosheets 110 and 115, and sidewall spacer 185. Alternatively, as provided above, sacrificial nanosheets 110 and 115 formed from a high Ge content SiGe can be selectively removed using an etchant such as dry HCl.

Dielectric spacers 230 are then formed alongside the sacrificial gate hardmasks 210 and sacrificial gates 200 and the spaces created from the removal of sacrificial nanosheets 110. Suitable materials for dielectric spacers 230 include, but are not limited to, SiOx, SiC and/or SiCO. A process such as CVD, ALD or PVD can be employed to deposit the dielectric spacers 230 alongside the sacrificial gate hardmasks 210/sacrificial gates 200 which will also fill the spaces created from the removal of sacrificial nanosheets 110.

Figure 12A:
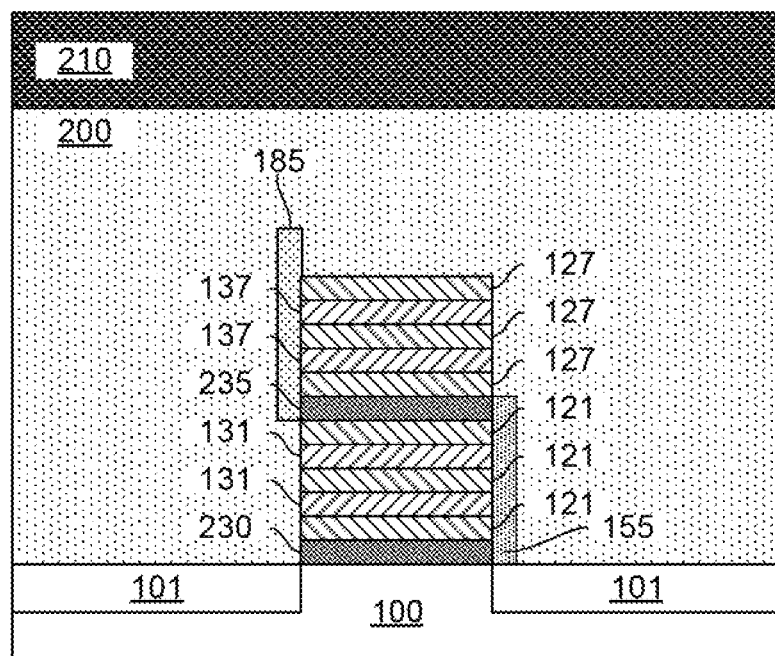
FIG. 12a depicts forming a first nanosheet stack, a second nanosheet stack, and a third nanosheet stack along the x-cross section, according to an example embodiment.
Figure 12B:
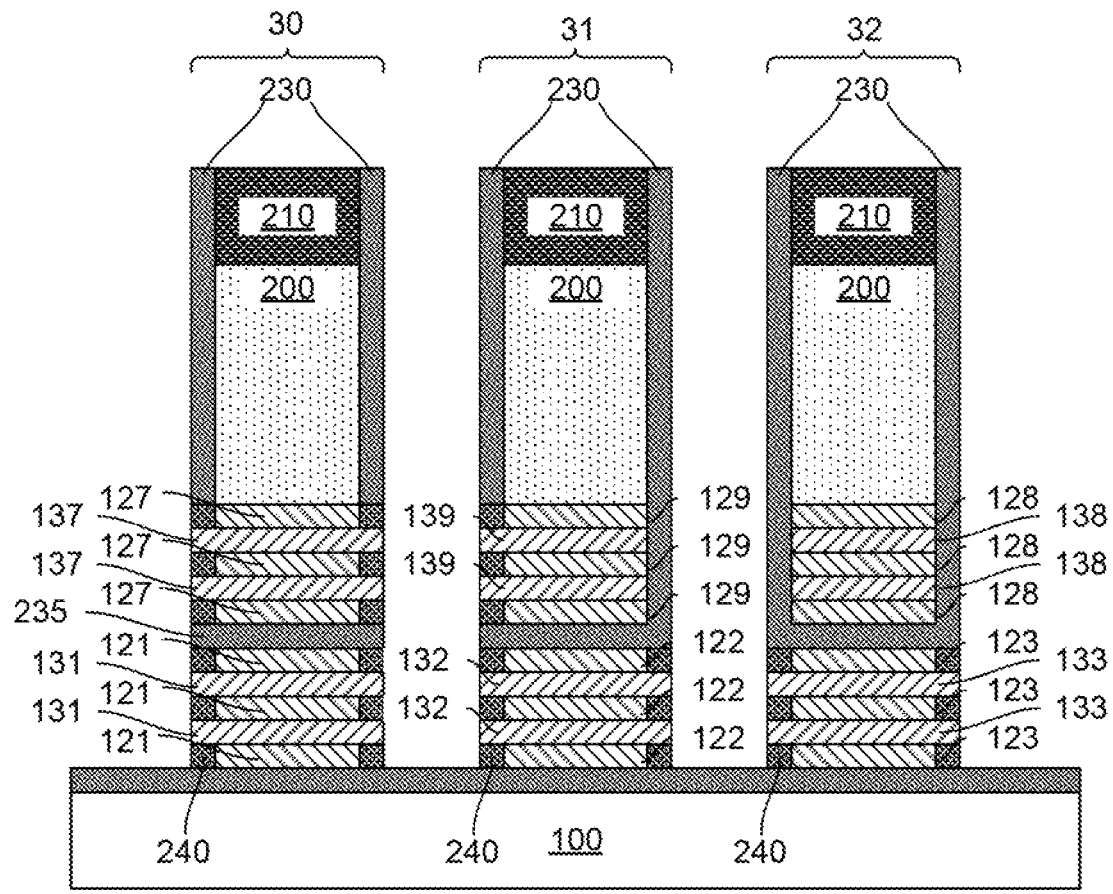
FIG. 12b depicts forming a first nanosheet stack, a second nanosheet stack, and a third nanosheet stack along the y-cross section, according to an example embodiment.
Figure 18A:
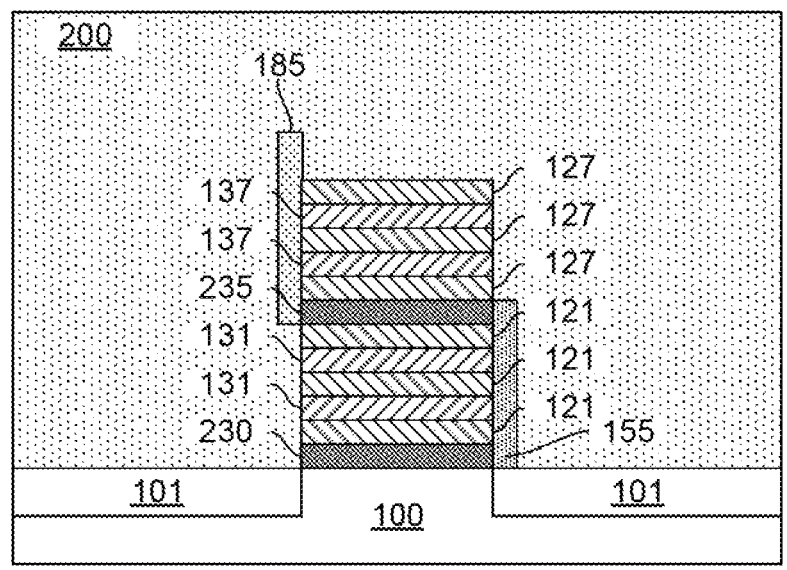
FIG. 18a depicts exposing the sacrificial gate along the x-cross section, according to an example embodiment.
Figure 18B:
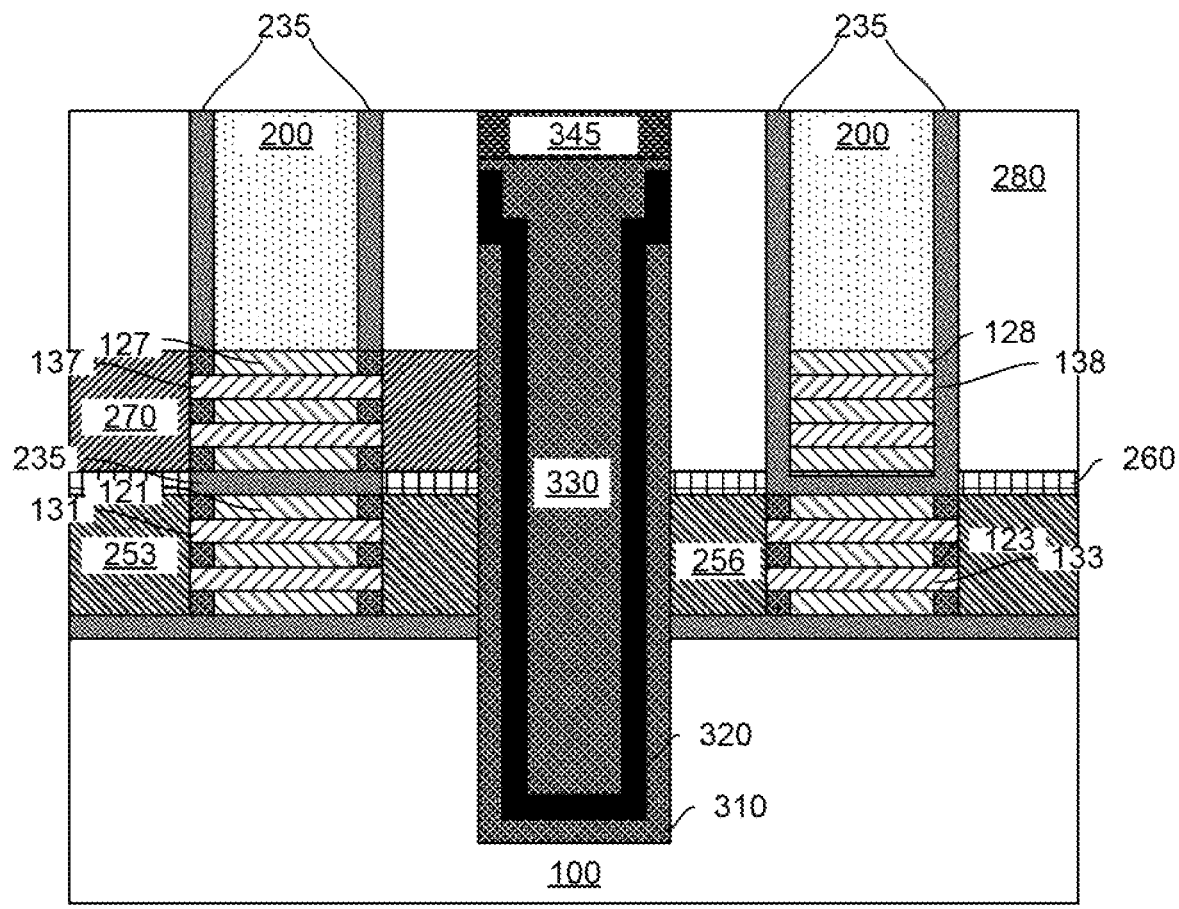
FIG. 18b depicts exposing the sacrificial gate along the y-cross section, according to an example embodiment.

Referring to FIG. 12a&b, sacrificial gates 200 and dielectric spacers 230 may be used as a mask to pattern trenches in nanosheet device stack 105 in between the sacrificial gates 200. A directional (anisotropic) etching process such as RIE can be employed for the trench etch. As shown in FIG. 18a&b, this etch patterns nanosheet device stack 105 into multiple individual nanosheet stacks.

Still referring to FIG. 12a&b, inner spacers 240 are formed alongside the lower nanosheets 121, 122, and 123 and upper nanosheets 127, 128, 129 in each of the nanosheet stacks 30, 31, and 32. To do so, a selective etch is performed to recess lower nanosheets 121, 122, and 123 and upper nanosheets 127, 128, 129 exposed along the sidewalls of the nanosheet stacks 30, 31, and 32. See FIG. 18a&b. This recess etch forms pockets along the sidewalls of the nanosheet stacks 30, 31, and 32 that are then filled with a spacer material to form inner spacers 240 within the pockets. These inner spacers 240 will offset the replacement metal gates from the source/drain (see below). As provided above, according to an example embodiment, lower nanosheets 121, 122, and 123 and upper nanosheets 127, 128, 129 are formed from SiGe. In that case, a SiGe-selective non-directional (isotropic) etching process can be used for the recess etch. Suitable spacer materials for inner spacers 240 include, but are not limited to, silicon nitride (SiN), SiOx, SiC and/or SiCO. A process such as CVD, ALD or PVD can be employed to deposit the spacer material into the pockets. Excess spacer material is removed from the trenches using a directional (anisotropic) etching process such as RIE.

Figure 13A:
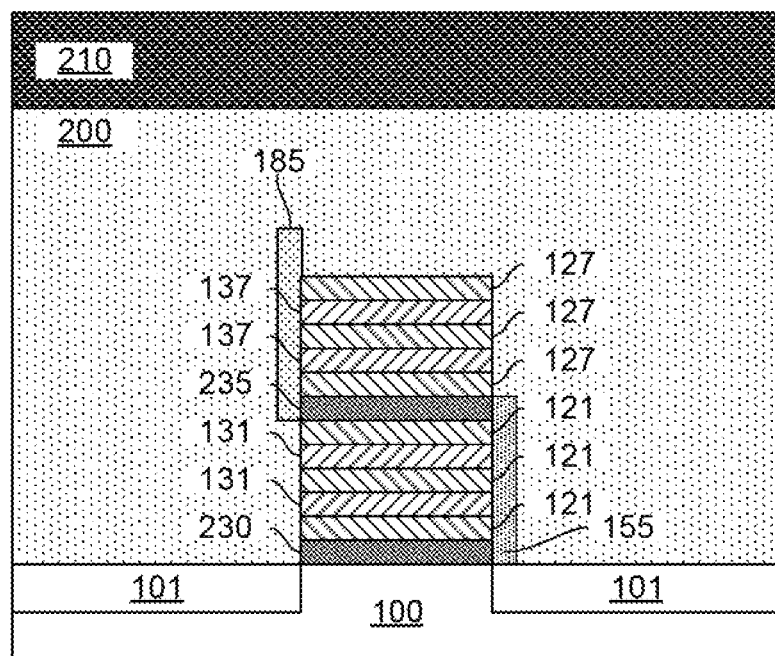
FIG. 13a depicts forming a bottom source/drain along the x-cross section, according to an example embodiment.
Figure 13B:
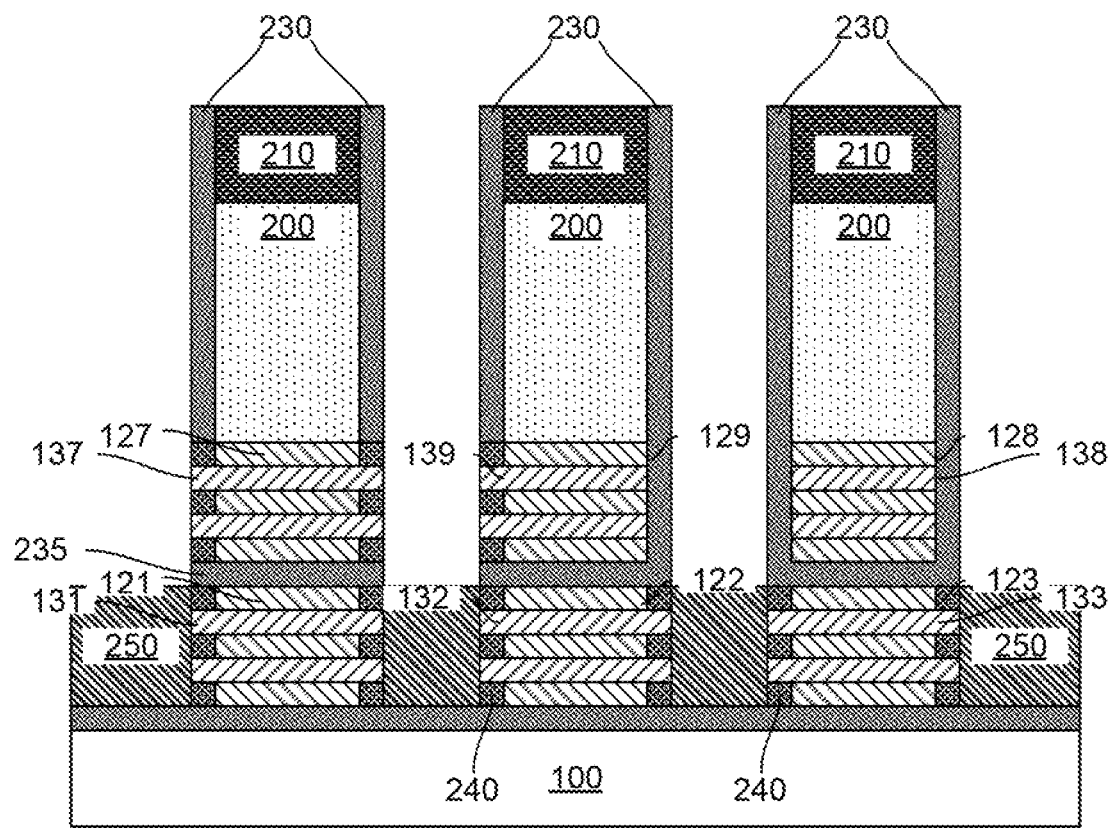
FIG. 13b depicts forming a bottom source/drain along the y-cross section, according to an example embodiment.

Referring to FIG. 13a&b, lower source/drain 250 are then formed in the trenches on opposite sides of the lower nanosheets 121, 122, and 123. See, for example, U.S. Pat. No. 10,418,449 issued to Paul et al., entitled "Circuits Based on Complementary Field-Effect Transistors," the contents of which are incorporated by reference as if fully set forth herein.

According to an example embodiment, lower source/drain are each formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). With inner spacers 240 in place along the nanosheet stacks 30, 31, and 32. sidewall, epitaxial growth of the lower source/drain 250 and upper source/drain 270 is templated from the (exposed) ends of lower nanosheets 121, 122, and 123 and upper nanosheets 127, 128, 129, respectively. As provided above, the lower nanosheets may form a device of a first polarity, i.e., a PFET or an NFET, and the upper nanosheets in the stack may form a device of a second/opposite polarity, i.e., an NFET if the lower device is a PFET, or vice versa. For instance, in one exemplary, non-limiting embodiment the lower nanosheets form a PFET whereby the lower source/drain 250 contain a p-type dopant, and the upper nanosheets form an NFET whereby the upper source/drain 270 contain an n-type dopant. However, polarities of the lower nanosheets and upper nanosheets may be the same, depending on the circuits constructed, as described in more detail with reference to FIG. 23-27.

Namely, according to an example embodiment, a first (n- or p-type) doped epitaxial material is grown in trenches on opposite sides of the nanosheet stacks 30, 31, and 32. and then recessed to form the lower source/drain 250. As shown in FIG. 18a&b, inner spacers 240 separate lower source/drain 250 from the lower nanosheets 121, 122, and 123. A directional (anisotropic) etching process such as RIE can be used to recess the lower source/drain 250.

Figure 14A:
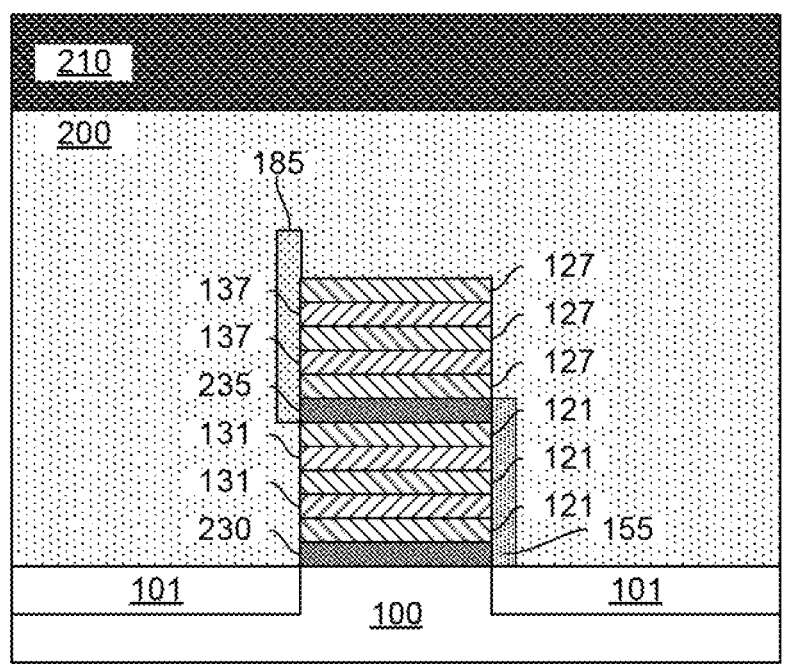
FIG. 14a depicts forming a spacer layer and top source/drain along the x-cross section, according to an example embodiment.
Figure 14B:
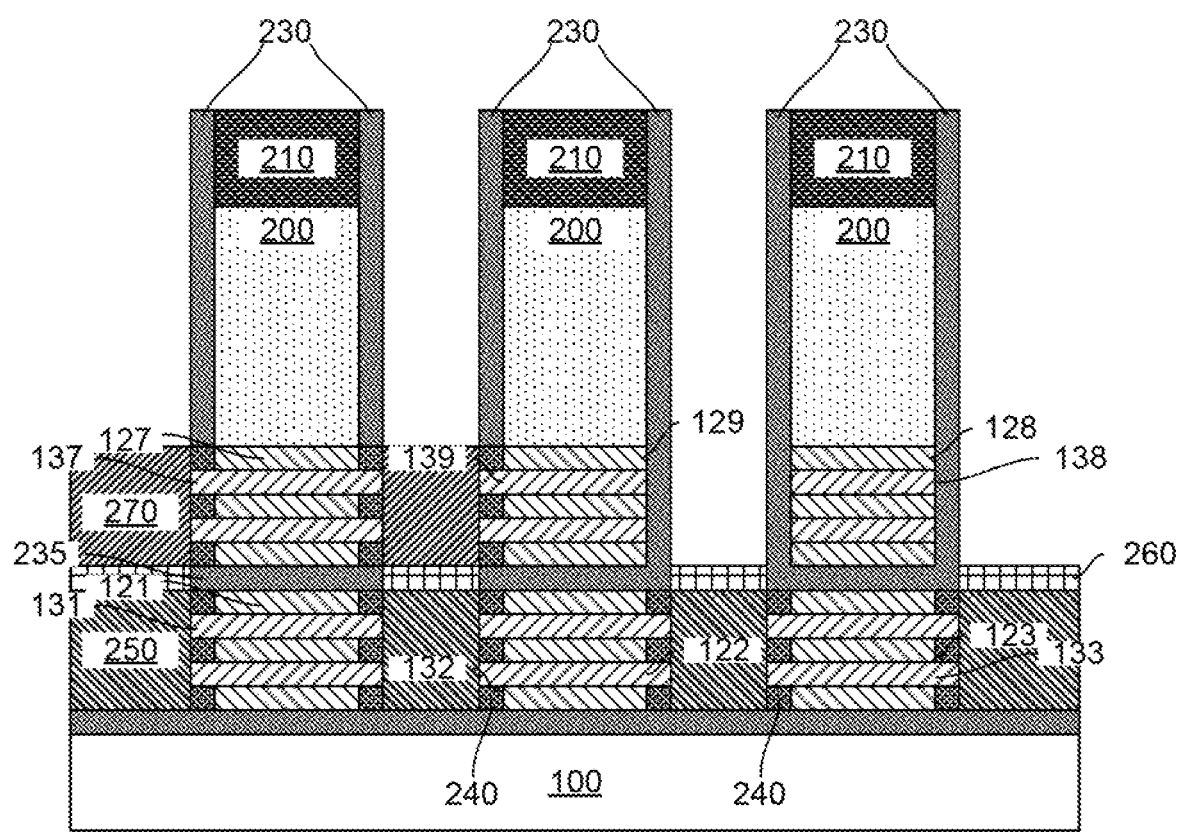
FIG. 14b depicts forming a spacer layer and top source/drain along the y-cross section, according to an example embodiment.

Referring to FIG. 14a&b, A spacer material may be deposited into the trenches over the lower source/drain 250 and then recessed to form the isolation spacer 260. Suitable materials for isolation spacer 260 include, but are not limited to, SiN, SiOx, SiC and/or SiCO. A process such as CVD, ALD or PVD can be employed to deposit the spacer material.

A second (n- or p-type) doped epitaxial material is grown in trenches on opposite sides of the nanosheet stack 30 and on one side of nanosheet stack 31 over isolation spacer 260 and then recessed to form the upper source/drain 270. As shown in FIG. 14a&b, inner spacers 240 separate upper source/drain 270 from the upper nanosheets 127, 128, 129. A directional (anisotropic) etching process such as RIE can be used to recess the upper source/drain 270. Further, as only first stack upper nanosheet 137 and second upper nanosheet 139 are exposed in the first region 10, epitaxial growth is confined to the first region.

Figure 15A:
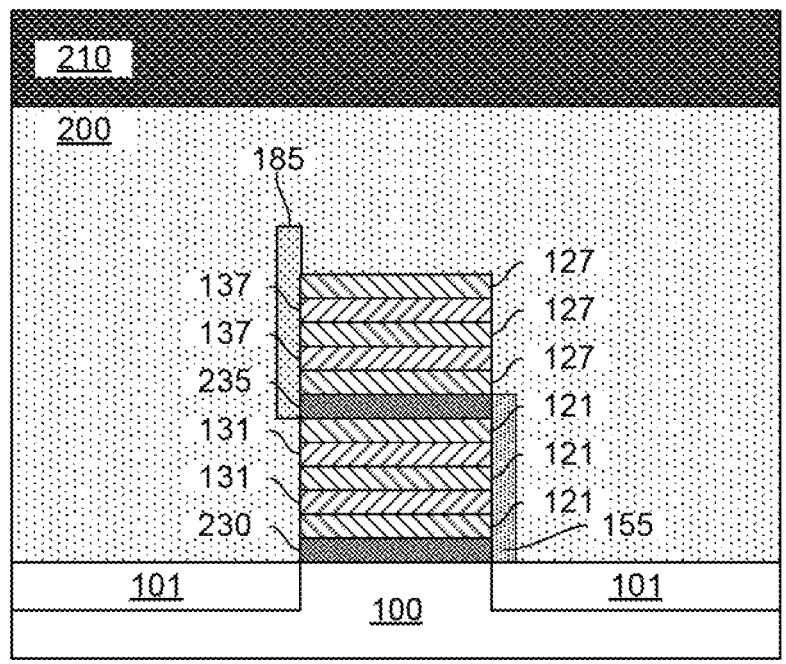
FIG. 15a depicts depositing an ILD along the x-cross section, according to an example embodiment.
Figure 15B:
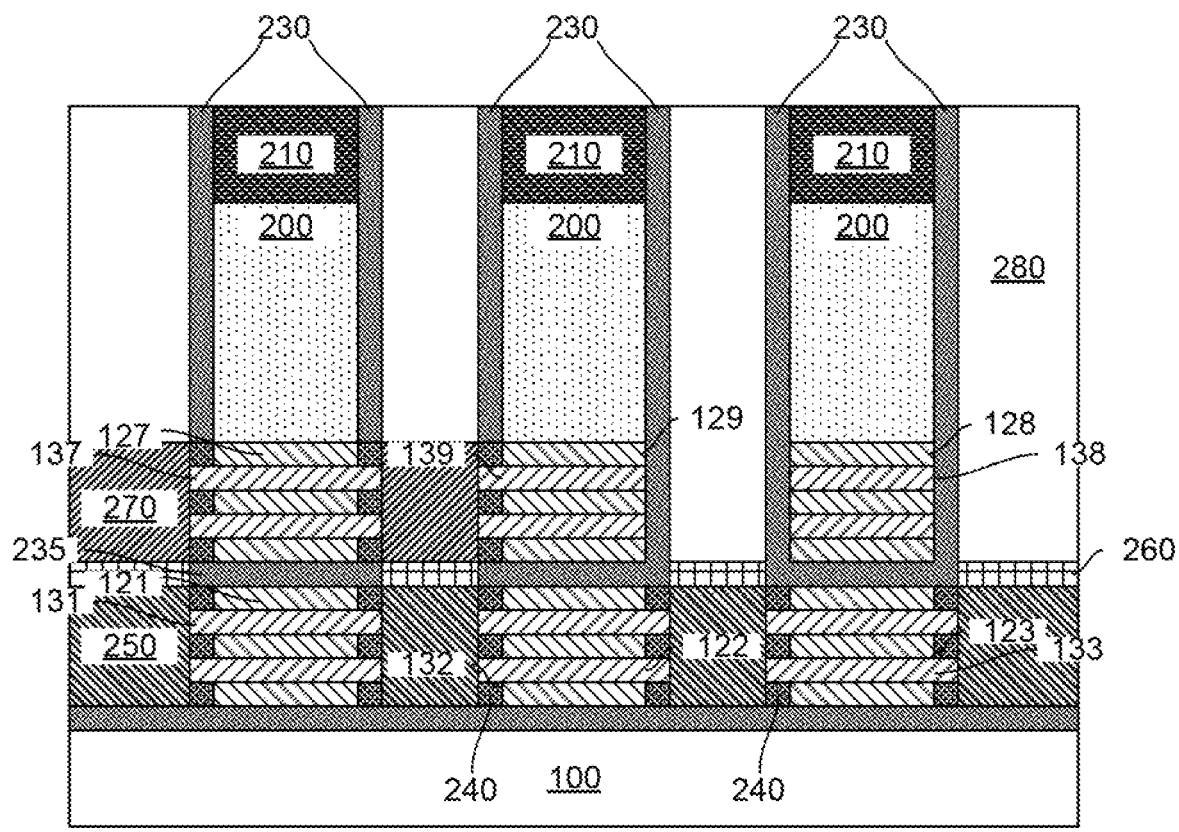
FIG. 15b depicts depositing an ILD along the y-cross section, according to an example embodiment.

Referring to FIG. 15a&b, following formation of the lower source/drain 250 and upper source/drain 270, sacrificial gates 200 are surrounded by an interlayer dielectric (ILD) 280. Suitable ILD materials include, but are not limited to, oxide low-κ materials such as silicon oxide ($SiO_x$) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as CVD, ALD or PVD can be employed to deposit ILD 280 around the sacrificial gates 200. Following deposition, ILD 280 can be planarized using a process such as chemical mechanical polishing (CMP).

Figure 16A:
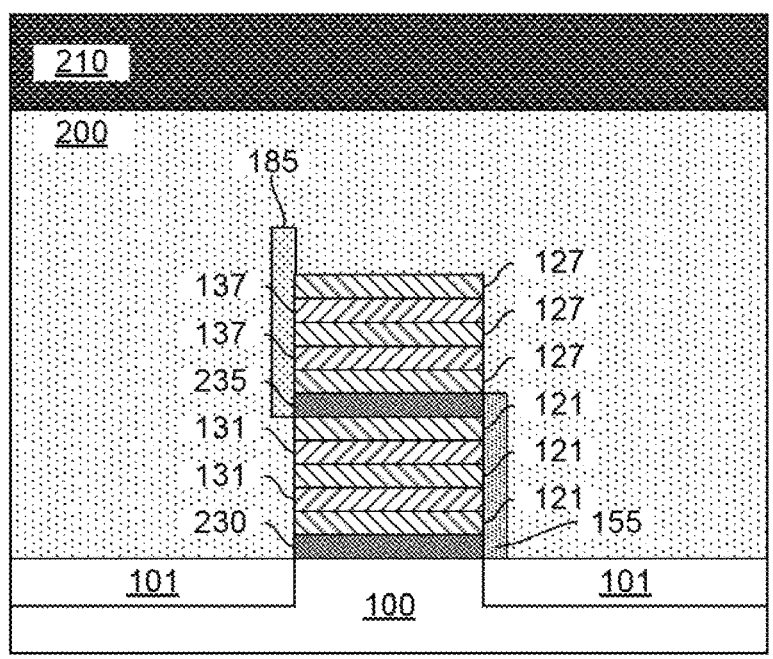
FIG. 16a depicts removing the second nanosheet stack along the x-cross section, according to an example embodiment.
Figure 16B:
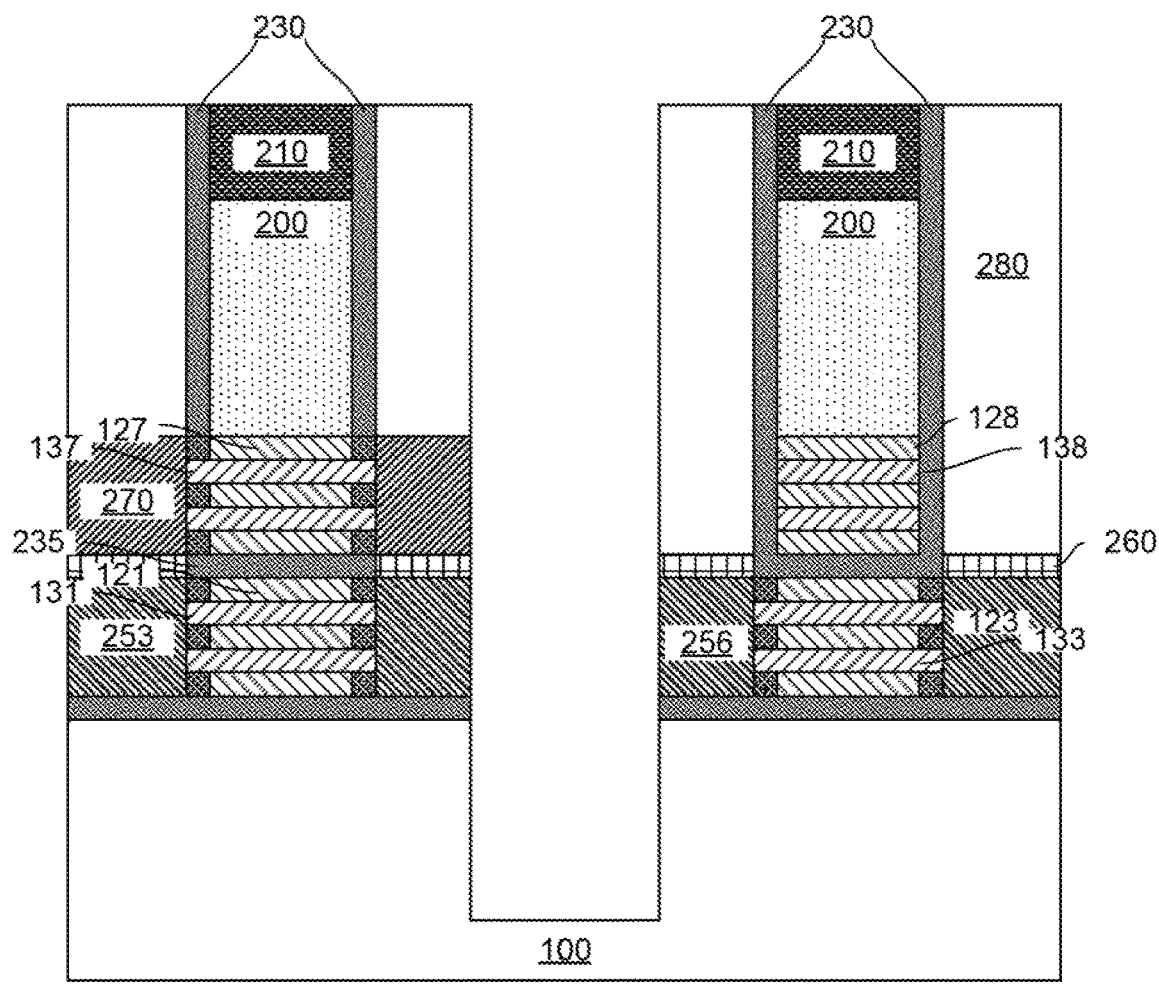
FIG. 16b depicts removing the second nanosheet stack along the y-cross section, according to an example embodiment.

Referring to FIG. 16a&b, pattern and removal of nanosheet stack 32 may be performed. The removal of the layered structure may be performed by patterning a lithographic mask above, and performing an anisotropic etch, such as a RIE etch, to remove the material below the unpatterned portion of the lithographic mask stopping in the substrate 100. Removal of nanosheet stack leaves source/drain 253 of the bottom portion of nanosheet stack 31 and source/drain 256 of nanosheet stack 33.

Figure 17A:
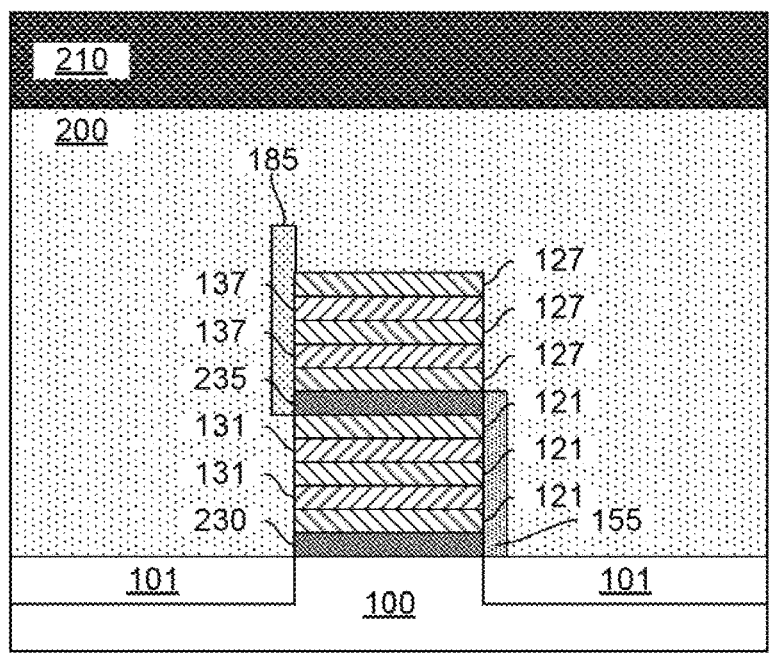
FIG. 17a depicts forming a capacitor where the second nanosheet stack was located along the x-cross section, according to an example embodiment.
Figure 17B:
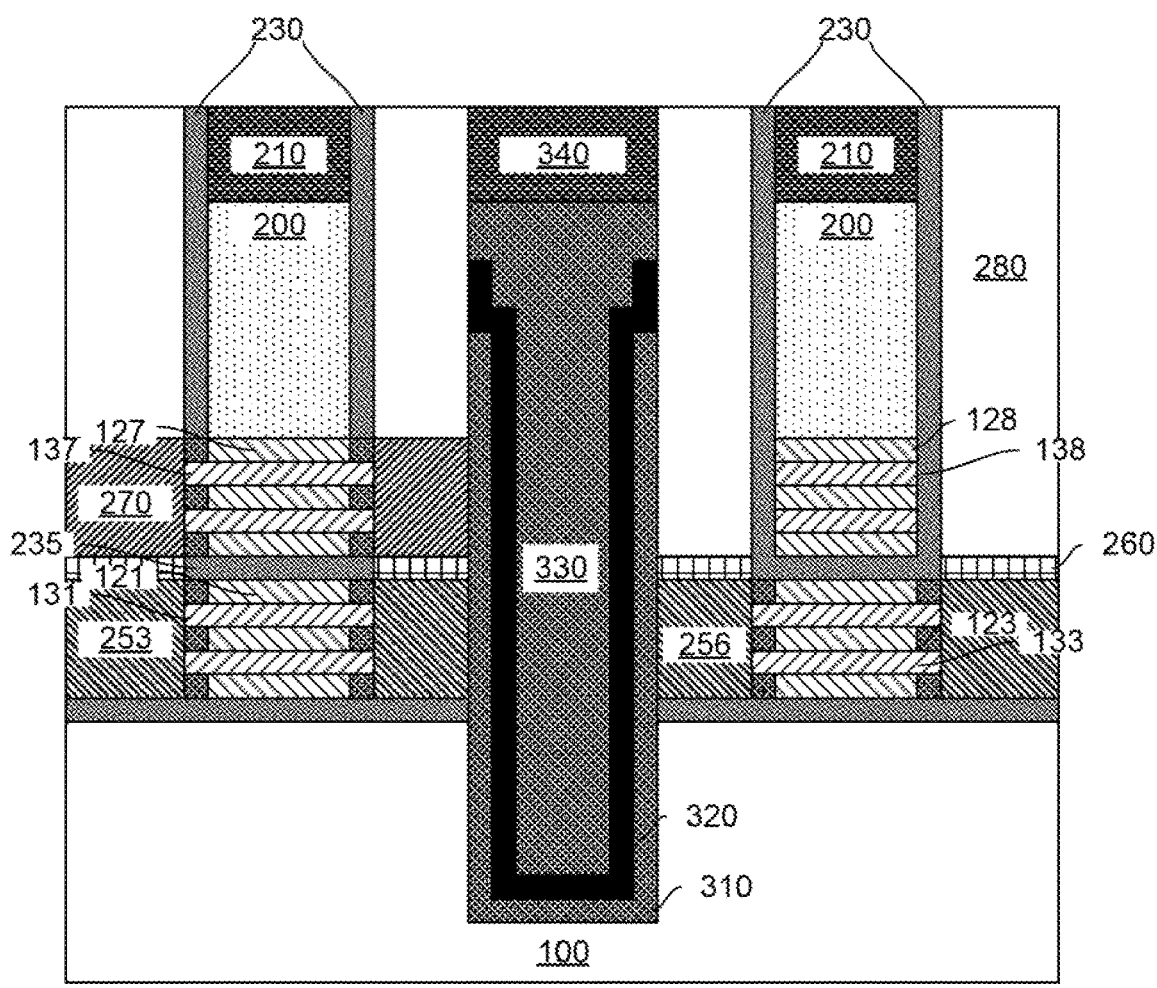
FIG. 17b depicts forming a capacitor where the second nanosheet stack was located along the y-cross section, according to an example embodiment.

Referring to FIG. 17a&b, an embedded capacitor may be formed in the trench created by removing nanosheet stack 32 by depositing a first conductive layer 310, a capacitive dielectric 320, and a second conductive layer 330. Prior to deposition of the first conductive layer 310, a dielectric layer may be deposited in the trench and recessed to only line the substrate 100, to reduce leakage to the substrate. The first conductive layer may be deposited so that it is in contact with bottom source/drain 150 and top source/drain 270. The first conductive layer 310 may have a thickness ranging from about 2 nm to 10 nm, although a thickness of the first conductive layer 310 less than 2 nm or greater than 10 nm may be conceived. The first conductive layer 310 may include any suitable conductive material, including but not limited to, doped polycrystalline or amorphous silicon, germanium, silicon germanium, a metal (e.g., tungsten, titanium, tantalum, ruthenium, zirconium), a conducting metallic compound material (e.g., tantalum nitride, titanium nitride, tungsten silicide, tungsten nitride, titanium nitride, tantalum nitride), carbon nanotube, conductive carbon, or any suitable combination of these materials. The first conductive layer 310 can be deposited by any suitable methods, including but not limited to, atomic layer deposition (ALD), chemical vapor deposition (CVD), low-pressure chemical vapor deposition (LPCVD), ultrahigh vacuum chemical vapor deposition (UHVCVD), metalorganic chemical vapor deposition (MOCVD), physical vapor deposition, sputtering, plating, evaporation, spin-on-coating, ion beam deposition, electron beam deposition, laser assisted deposition, and chemical solution deposition. In an embodiment, the first conductive layer 310 includes doped polysilicon deposited by LPCVD.

A capacitive dielectric 320 may be deposited onto the first conductive layer 310. According to an example embodiment, capacitive dielectric 320 is a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$). A process such as CVD, ALD or PVD can be employed to deposit capacitive dielectric 320. According to an example embodiment, capacitive dielectric 320 has a thickness of from about 1 nanometer (nm) to about 5 nm and ranges therebetween.

The second conductive layer 330 may have a thickness ranging from about 2 nm to 10 nm, although a thickness of the second conductive layer 330 less than 2 nm or greater than 10 nm may be conceived. The second conductive layer 330 may include any suitable conductive material, including but not limited to, doped polycrystalline or amorphous silicon, germanium, silicon germanium, a metal (e.g., tungsten, titanium, tantalum, ruthenium, zirconium), a conducting metallic compound material (e.g., tantalum nitride, titanium nitride, tungsten silicide, tungsten nitride, titanium nitride, tantalum nitride), carbon nanotube, conductive carbon, or any suitable combination of these materials. The second conductive layer 330 can be deposited by any suitable methods, including but not limited to, atomic layer deposition (ALD), chemical vapor deposition (CVD), low-pressure chemical vapor deposition (LPCVD), ultrahigh vacuum chemical vapor deposition (UHVCVD), metalorganic chemical vapor deposition (MOCVD), physical vapor deposition, sputtering, plating, evaporation, spin-on-coating, ion beam deposition, electron beam deposition, laser assisted deposition, and chemical solution deposition. In an embodiment, the second conductive layer 330 includes doped polysilicon deposited by LPCVD.

A capacitor hardmask 340 are then formed above the second conductive layer 330. Suitable materials for the capacitor hardmask 340 include, but are not limited to, nitride hardmask materials such as SiN, SiON and/or SiCN, and/or oxide hardmask materials such as SiOx.

Referring to FIG. 18a&b, CMP may be performed to reduce the height of the structure of FIG. 17a&b, thereby removing sacrificial gate hardmasks 210 and exposing a top surface of sacrificial gate 200.

Figure 19A:
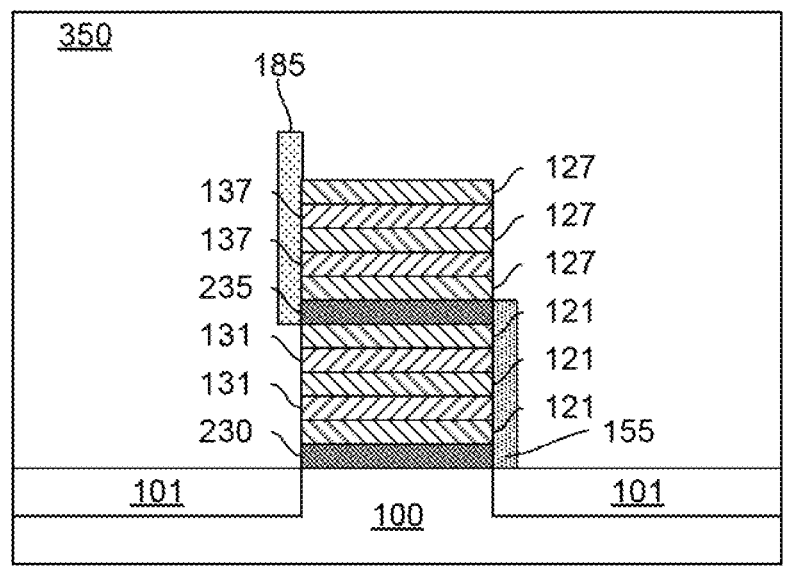
FIG. 19a depicts removing the top nanosheets in the third nanosheet stack along the x-cross section, according to an example embodiment.
Figure 19B:
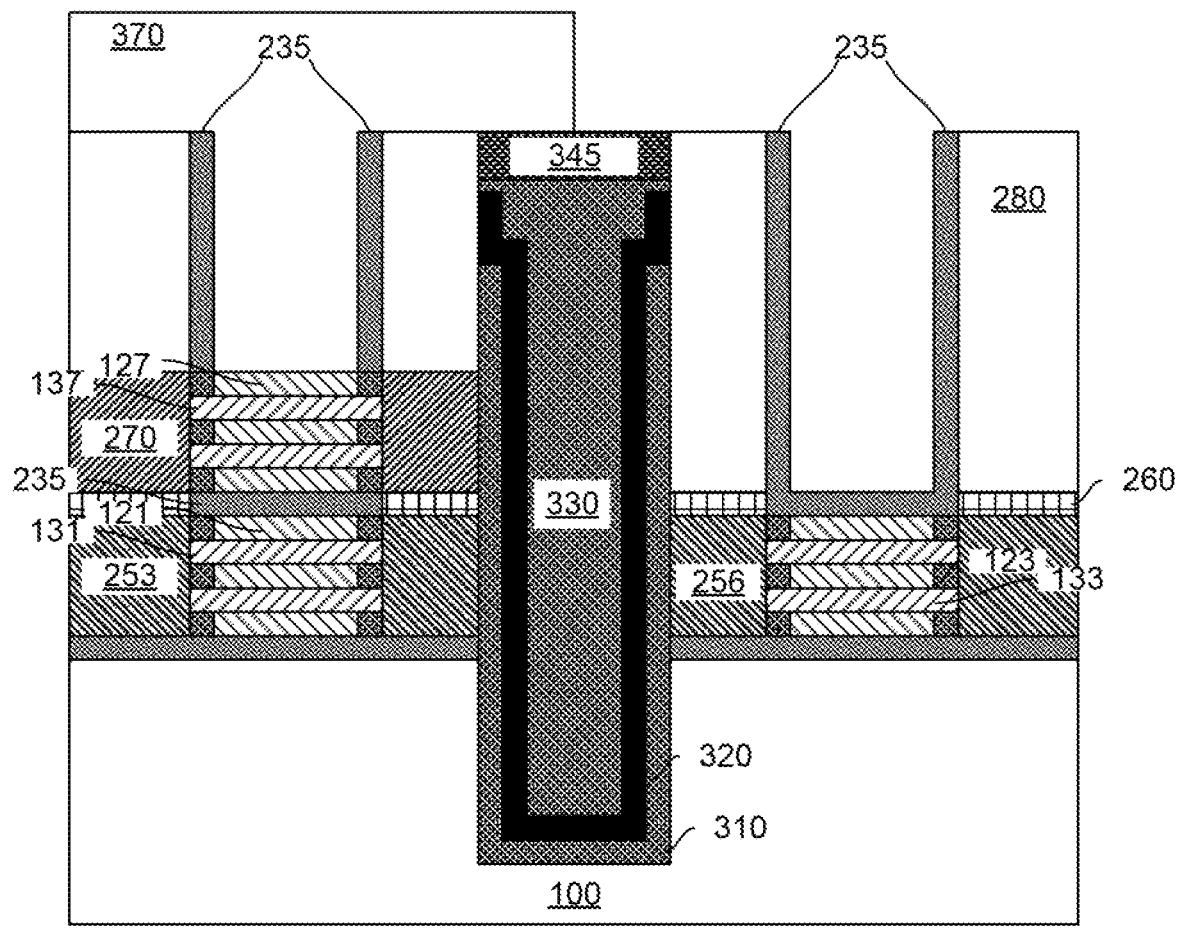
FIG. 19b depicts removing the top nanosheets in the third nanosheet stack along the y-cross section, according to an example embodiment.

Referring to FIG. 19a&b, sacrificial gate 200 may be removed and an OPL mask 370 may be formed over first region, and (optionally) first nanosheet material 128 and second nanosheet material 138 may be removed. Sacrificial gate 200 may be removed by any suitable etching process known in the art capable of selectively removing the sacrificial gate 200 without substantially removing material from the surrounding structures. In an example embodiment, the sacrificial gate 200 may be removed, for example, by a reactive ion etching (RIE) process capable of selectively removing silicon.

Figure 20A:
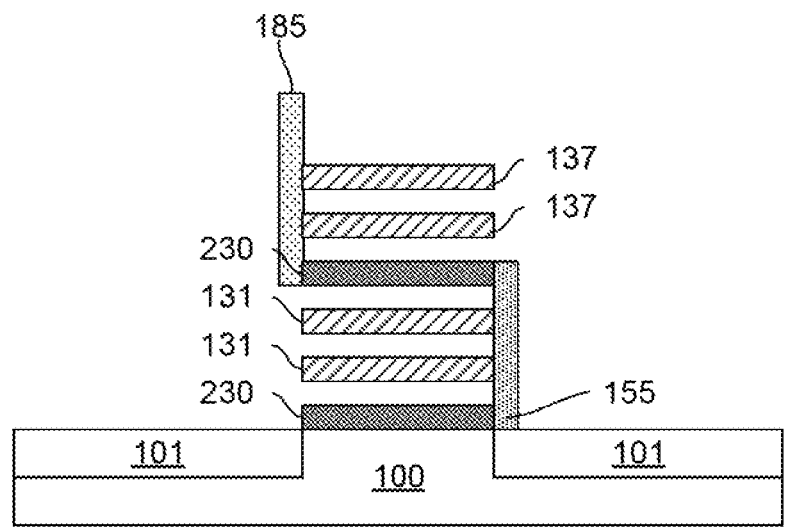
FIG. 20a depicts removing alternating nanosheet layers along the x-cross section, according to an example embodiment.
Figure 20B:
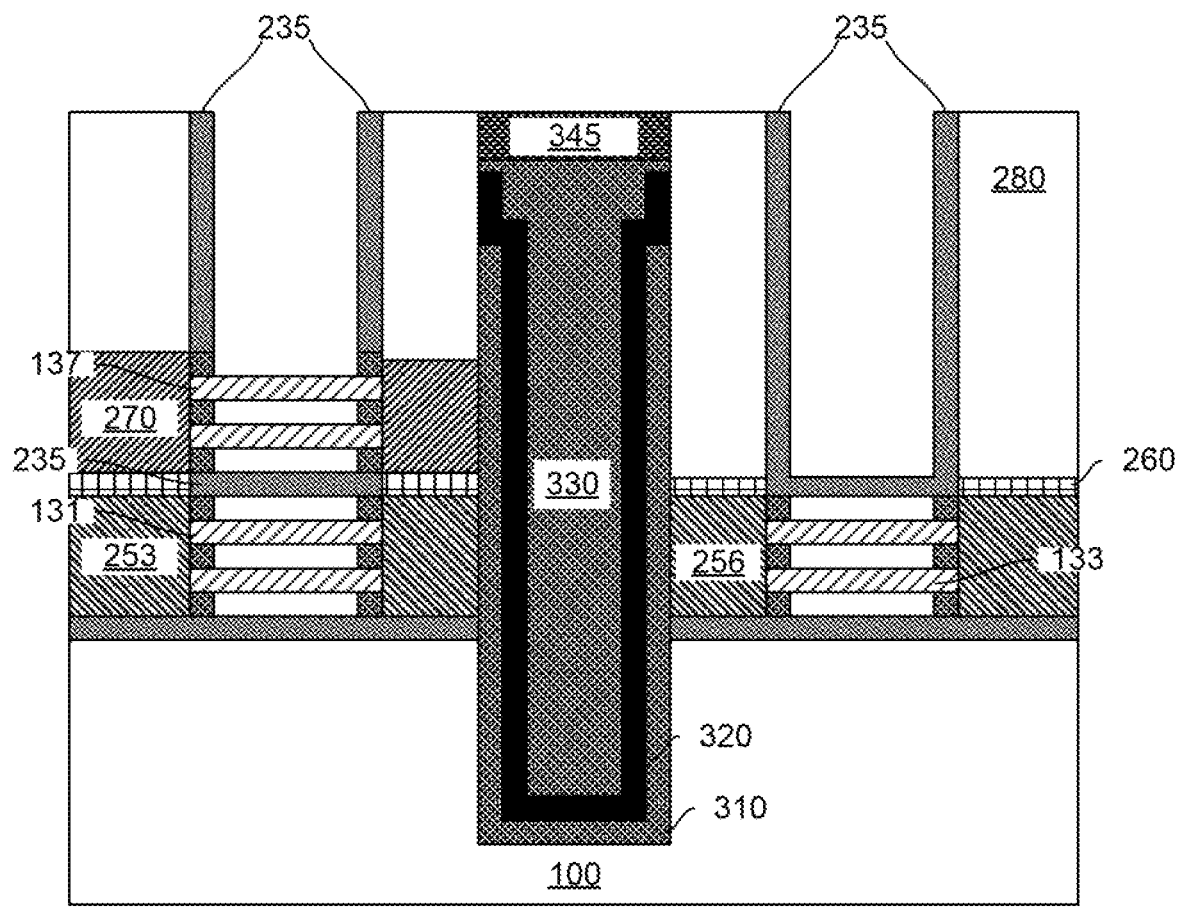
FIG. 20b depicts removing alternating nanosheet layers along the y-cross section, according to an example embodiment.

Referring to FIG. 20a&b, the lower nanosheets 121 and 123 and upper nanosheets 127, now accessible through gate trenches, are then selectively removed. Removal of these nanosheets releases the lower nanosheets 131 and 133, and upper nanosheets 137 from the nanosheet stacks 30, 31, and 32. in the channel region of the device. Namely, gaps are now present in the nanosheet stacks 30, 31, and 32. in between the lower nanosheets 131 and 133, and upper nanosheets 137 in the channel region of the device. In this example, lower nanosheets 131 and 133, and upper nanosheets 137 will be used to form the nanosheet channels of the stacked nanosheet device. The gate trenches and the gaps in the nanosheet stacks 30, 31, and 32. enable replacement metal gates (RMGs), i.e., including a gate dielectric and at least one workfunction metal, to be formed that fully surround a portion of each of the nanosheet channels in a gate-all-around configuration.

Figure 21A:
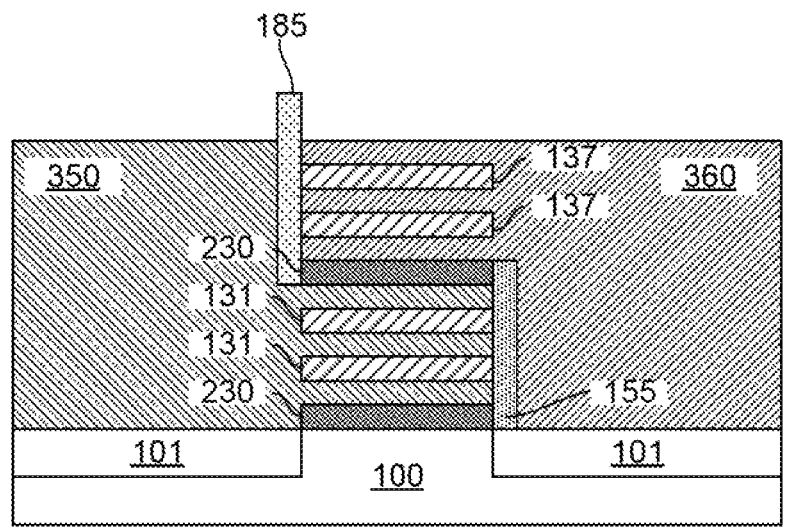
FIG. 21a depicts gate formation along the x-cross section, according to an example embodiment.
Figure 21B:
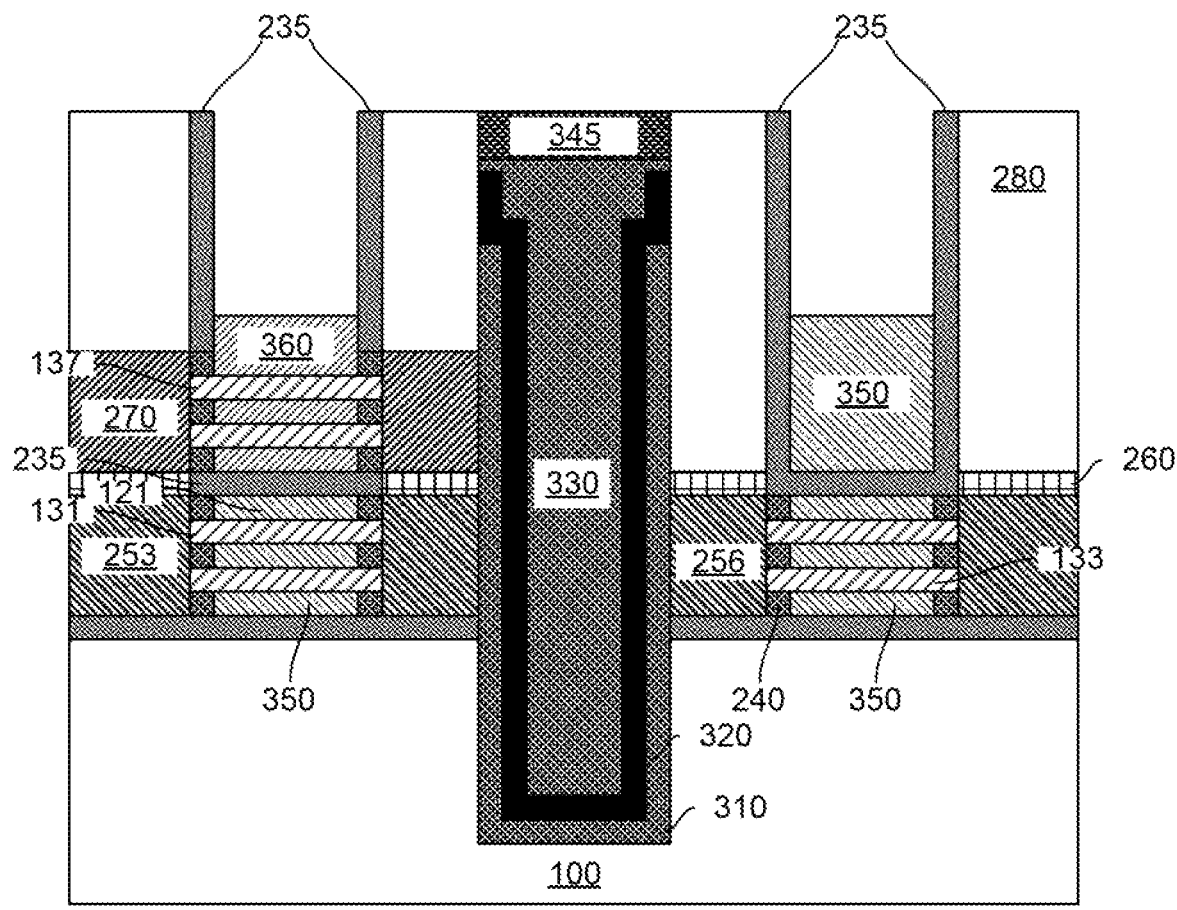
FIG. 21b depicts gate formation along the y-cross section, according to an example embodiment.

Referring to FIG. 21a&b, a first RMG 350 and a second RMG 360 may be formed. The first RMG 350 and the second RMG 360 may each contain a gate dielectric, a work function metal and a metal contact. A conformal gate dielectric may be deposited into and lining each of the gate trenches and gaps in the channel region of the device. According to an example embodiment, gate dielectric is a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$). A process such as CVD, ALD or PVD can be employed to deposit gate dielectric. According to an example embodiment, gate dielectric has a thickness of from about 1 nanometer (nm) to about 5 nm and ranges therebetween. A reliability anneal can be performed following deposition of gate dielectric. In one embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as a nitrogen-containing ambient.

Still referring to FIG. 21a&b, a first workfunction metal may be deposited into the gate trenches and gaps on the gate dielectric. The first workfunction metal may be conform to the selected polarity of the gate. At this point in the process, the first workfunction metal is disposed on the lower nanosheets 131 and 133 as well as the upper nanosheets 137 However, as will be described in detail below, this first workfunction metal will subsequently be removed from the upper nanosheets 137 and replaced with a second workfunction metal of the opposite polarity. Namely, if the first workfunction metal is a p-type metal (and the lower nanosheets 131 and 133 are used to form a PFET device), then the second workfunction metal may be an n-type metal (and the upper nanosheets 137 are used to form an NFET device). Alternatively, if the first-workfunction metal is an n-type metal (and the lower nanosheets 131 and 133 are used to form an NFET device), then the second workfunction metal will be a p-type metal (and the upper nanosheets 137 are used to form a PFET device). In yet another embodiment, the first workfunction metal and the second workfunction metal may be the same polarity (both n-type or both p-type).

Suitable n-type workfunction metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

A process such as CVD, ALD or PVD can be employed to deposit the first workfunction metal. Following deposition, the metal overburden can be removed using a process such as CMP. Further, it is notable that, while the instant example shows first workfunction metal pinching off the gaps between the lower nanosheets 131 and 133 other workfunction metal configurations are also contemplated herein such as the first and/or second workfunction metals being composed of multiple metals and/or multiple layers of metals.

To remove the first workfunction metal from the upper nanosheets 137, the first workfunction metal and gate dielectric are first recessed in the gate trenches. To do so, as shown in FIG. 23, a planarizing material such as an OPL material is deposited over the device structure and into the gate trenches, and then recessed. A casting process such as spin coating or spray casting can be employed to deposit the planarizing material. A directional (anisotropic) etching process such as RIE can be used to recess the planarizing material. The first workfunction metal and gate dielectric are then recessed (e.g., using an anisotropic etching process such as RIE) down to the (recessed) planarizing material. The planarizing material is removed. By way of example only, an OPL planarizing material can be removed using a process such as ashing.

The first workfunction metal is then removed from the upper nanosheets 137. A recess etch is used to remove the first workfunction metal from the upper nanosheets 137 As will be described in conjunction with the description of FIG. 25 below, a block mask is used to cover/mask the first workfunction metal disposed on the lower nanosheets 131 and 133 This block mask is, however, not visible in the view depicted in FIG. 24.

According to an example embodiment, the recess etch of the first workfunction metal is performed using a non-directional (isotropic) metal-selective etching process. For instance, an SC1 wet clean (e.g., hydrofluoric acid (HF) and a hydrogen peroxide ($H_2O_2$): ammonium hydroxide ($NH_4OH$) mixture) can be employed to recess the workfunction metal selective to the gate dielectric. Notably, the dielectric spacers 235 prevent damage to the underlying first workfunction metal disposed on the lower nanosheets 131 and 133 due to undercut during the recess etch.

Removal of the first workfunction metal from the upper nanosheets 137 reopens the gate trenches and gaps in the upper nanosheet stack 30. A second workfunction metal may be deposited into the gate trenches and gaps on the gate dielectric. The second workfunction metal may be selected as a suitable n-type or p-type material based on the desired device characteristics. Suitable n-type workfunction metals and p-type workfunction metals were provided above.

A process such as CVD, ALD or PVD can be employed to deposit the second workfunction metal. Following deposition, the metal overburden can be removed using a process such as CMP. Further, it is notable that, while the instant example shows second workfunction metal pinching off the gaps between the upper nanosheets 137 other workfunction metal configurations are also contemplated herein such as the first and/or second workfunction metals being composed of multiple metals and/or multiple layers of metals. As shown in FIG. 26, following deposition the second workfunction metal is recessed in the gate trenches. The process for recessing the workfunction metal in this manner, i.e., using a planarizing material such as an OPL, was described above.

A low-resistivity gate fill metal may be deposited into the gate trenches over the second workfunction metal and recessed. Suitable low-resistivity gate fill metals include, but are not limited to, TiN and/or W. A process such as CVD, ALD or PVD can be employed to deposit the low-resistivity gate fill metal into the gate trenches.

Figure 22A:
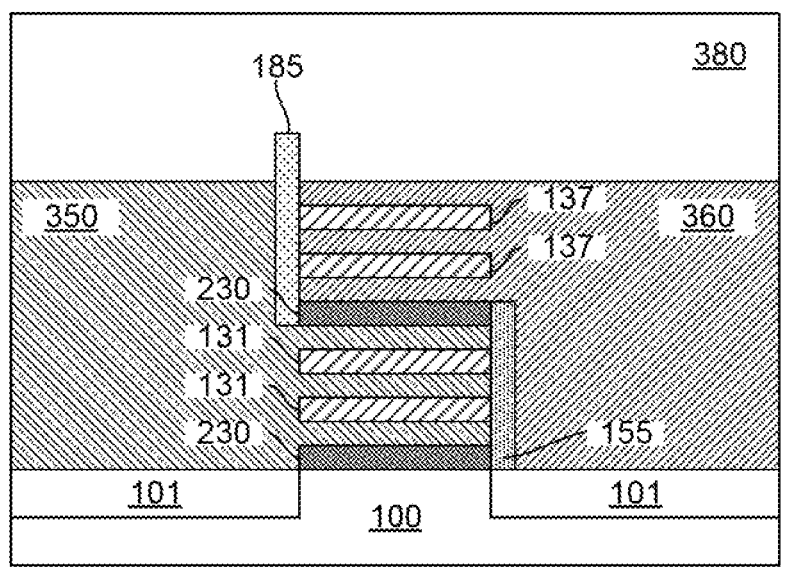
FIG. 22a depicts capping of the gates along the x-cross section, according to an example embodiment.
Figure 22B:
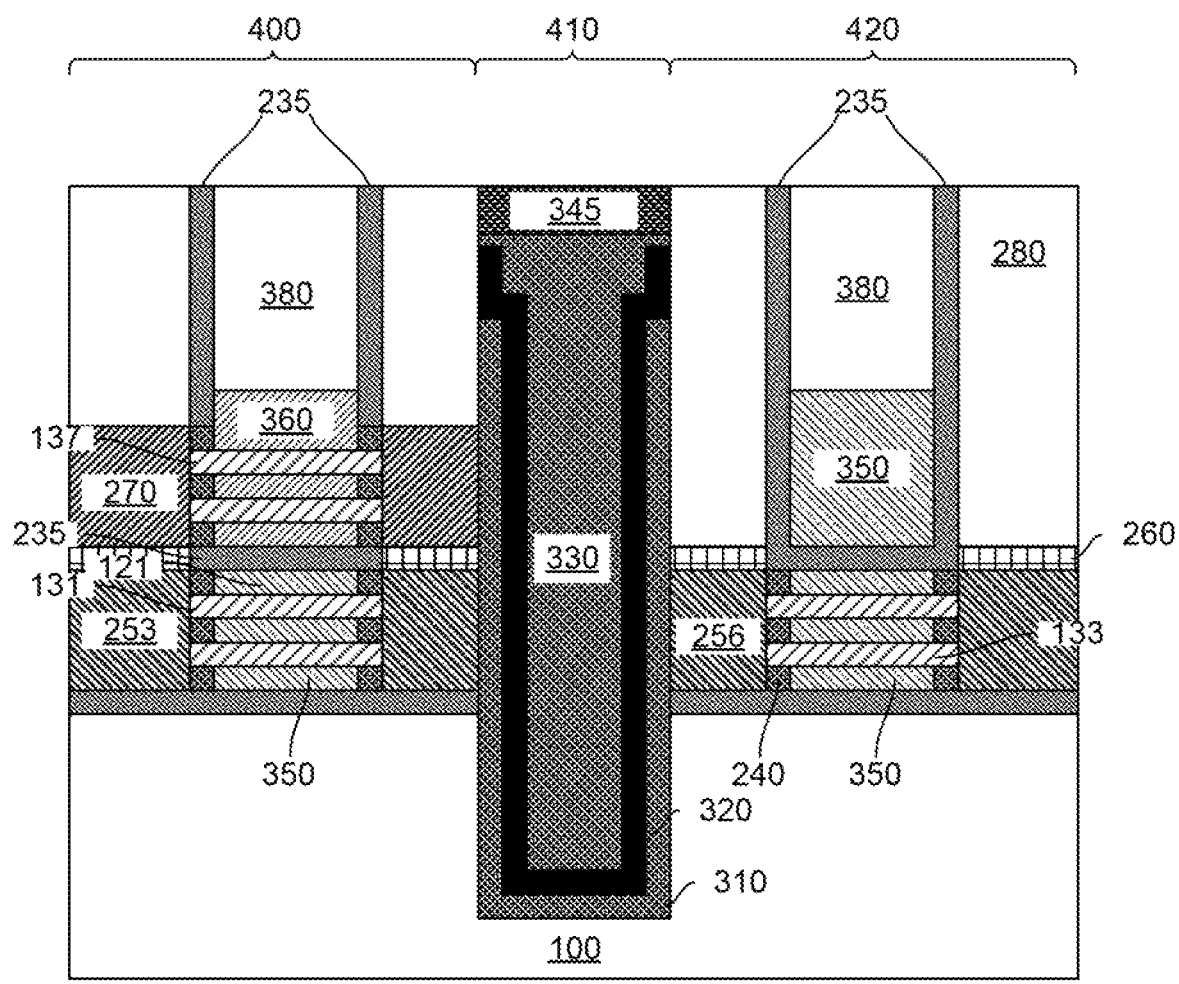
FIG. 22b depicts capping of the gates along the y-cross section, according to an example embodiment.

Referring to FIG. 22*a*&*b*, a dielectric cap 380 may be deposited into the gate trenches over the gate fill metal. Suitable materials for dielectric cap 380 include, but are not limited to, SiOx, SiN, SiON, and/or SiCN. A process such as CVD, ALD or PVD can be employed to deposit the dielectric cap material into the gate trenches. Following deposition, the dielectric cap material can be planarized using a process such as CMP.

Following the deposition of the dielectric cap, a three-component structure is created having a first region 400, a second region 410, and a third region 420. In such a structure, the first region 400 may include both transistors used in the multiply and accumulate circuitry depicted in FIG. 1*a*-1*f*. In first region 400, the materials selected for first RMG 350 and source/drain 253 match the requirements of the Mu FET of the multiply and accumulate device. Additionally, in first region 400, the materials selected for second RMG 360 and source/drain 270 match the requirements of the Md FET of the multiply and accumulate device. In second region 410, the trench capacitor of the multiply and accumulate device is located. In third region 420, a reset is located. The reset is not included in the multiply and accumulate circuit but is an additional component of the implemented neural network that may be included. Additionally, while the reset is depicted as a single gate, a dual gate structure similar to the first region 400 may be fabricated to maximize performance and space. By forming the three structures in line on a substrate level.

FIG. 23*a*-*f* depict the physical layout of the circuit of FIG. 1*a* according to the present specification. In such an embodiment, the first RMG 350 may use n-type materials, while RMG 360 may use p-type materials. In this embodiment, electrical connection 2210 is an input terminal receiving an input voltage (Vin), electrical connection 2220 is an output terminal producing an output voltage (Vout), electrical connection 2230 is connected to a positive supply voltage (VDD), electrical connection 2240 is connected to a negative supply voltage (VSS) or alternatively to the ground voltage (GND), electrical connection 2200 receives a reset signal (Reset), and electrical connection 2260 is connected to VSS (or alternatively to GND). Such a structure has a stacked nanosheet in a first region of the device. The top transistor of the stacked nanosheet includes nanosheet 137, second RMG 360, and source/drain 270. The bottom transistor of the stacked nanosheet includes nanosheet 131, first RMG 350, and source/drain 253. The structure contains a nanosheet transistor in a third region. The nanosheet transistor includes nanosheet 133, first RMG 350, and source/drain 256. The structure contains a capacitor in a second region, located between the first region and the third region. The capacitor includes a first conductive layer 310, a capacitive dielectric 320, and a second conductive layer 330. In such a structure, the bottom source drain 253 of the bottom transistor of the stacked nanosheet, and the bottom source drain 256 of the nanosheet transistor may use nFET source/drain materials, while the top source/drain 270 of the top nanosheet transistor may use pFET materials, however such material selection may be chosen in accordance with the embodiments shown in FIGS. 1a-1f. In such an embodiment, the stacked CFET located in the first region and the embedded capacitor located in the second region make up the example multiply-and-accumulate device, while the nanosheet transistor located in the third region is a reset connected to the output terminal of the multiply-and-accumulate devices depicted in FIGS. 1a-1f. Additionally, one having ordinary skill in the art would understand how to orient the depicted wiring, layout, and material selection in accordance with the devices depicted in FIGS. 1a-1f using the techniques laid out in the detailed description.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A device comprising:
    a substrate having a first region, a second region, and a third region, wherein the second region is between the first region and the third region;
    a capacitor in the second region, wherein the capacitor comprises a dielectric located between a first metal contact and a second metal contact;
    a stacked nanosheet device located on the first region of the substrate, wherein the stacked nanosheet device comprises a top transistor and a bottom transistor, and wherein a source/drain of the top transistor and a source/drain of the bottom transistor are in contact with the first metal contact; and
    a nanosheet device in the third region, wherein a source/drain of a transistor of the nanosheet device is in contact with the first metal contact.

2. The device of claim 1, wherein a portion of the capacitor is beneath a top surface of the substrate.

3. The device of claim 1, wherein the stacked nanosheet device in the third region comprises a reset switch for a multiply-and-accumulate operation.

4. The device of claim 1, wherein the stacked nanosheet device in the first region and the dielectric in the second region comprise a multiply-and-accumulate circuit.

5. The device of claim 4, wherein the first metal contact is connected to an input terminal of the multiply-and-accumulate circuit.

6. The device of claim 5, wherein the second metal contact is connected to an output terminal of the multiply-and-accumulate circuit.

7. The device of claim 1, wherein a first gate material of the top transistor is the same as a second gate material of the bottom transistor.

8. The device of claim 1, wherein a first gate material of the top transistor is different from a second gate material of the bottom transistor.

9. A multiply-and-accumulate circuit comprising:
    a stacked nanosheet device, wherein the stacked nanosheet device comprises a top transistor and a bottom transistor, and wherein a top source/drain of the top transistor and a bottom source/drain of the bottom transistor are in contact with a first metal contact of an embedded capacitor.

10. The circuit of claim 9, wherein a portion of the embedded capacitor is beneath a top surface of a substrate that the stacked nanosheet device is located on.

11. The circuit of claim 9, wherein the embedded capacitor comprises the first metal contact and a second metal contact separated by a dielectric, wherein the second metal contact is connected to an input terminal of the multiply-and-accumulate circuit.

12. The circuit of claim 9, wherein the first metal contact is connected to a $V_{out}$ of the multiply-and-accumulate circuit.

13. A device comprising:
    a nanosheet stack having a first region, a second region, and a third region, wherein the second region is between the first region and the third region;
    a capacitor in the second region, wherein the capacitor comprises a dielectric located between a first metal contact and a second metal contact;
    a stacked nanosheet device in the first region from the nanosheet stack, wherein the stacked nanosheet device comprises a top transistor and a bottom transistor, and wherein a source/drain of the top transistor and a source/drain of the bottom transistor are in contact with the first metal contact; and
    a stacked nanosheet transistor in the third region, wherein a source/drain of the stacked nanosheet transistor is in contact with the first metal contact.

14. The device of claim 13, wherein the stacked nanosheet transistor in the third region comprises a reset switch for a multiply-and-accumulate operation.

15. The device of claim 13, wherein the stacked nanosheet device in the first region and the dielectric in the second region comprises a multiply-and-accumulate circuit.

16. The device of claim 13, wherein the first metal contact is connected to an input terminal of a multiply-and-accumulate circuit.

17. The device of claim 13, wherein the second metal contact is connected to an output terminal of a multiply-and-accumulate circuit.

18. The device of claim 13, wherein a first gate material of the top transistor is the same as a second gate material of the bottom transistor.

19. The device of claim 13, wherein a first gate material of the top transistor is different from a second gate material of the bottom transistor.

* * * * *